United States Patent
Yoon et al.

(10) Patent No.: US 12,237,833 B2
(45) Date of Patent: Feb. 25, 2025

(54) SEMICONDUCTOR DEVICE INCLUDING PULSE WIDTH MODULATION CIRCUITS

(71) Applicant: Samsung Electronics Co., Ltd., Suwon-si (KR)

(72) Inventors: Sungwoo Yoon, Gyeonggi-do (KR); Jin Kwan Park, Gyeonggi-do (KR); Hyunah An, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 129 days.

(21) Appl. No.: 18/045,578

(22) Filed: Oct. 11, 2022

(65) Prior Publication Data

US 2023/0155575 A1    May 18, 2023

(30) Foreign Application Priority Data

Nov. 15, 2021  (KR) .......................... 10-2021-0157079
May 2, 2022    (KR) .......................... 10-2022-0054197

(51) Int. Cl.
*H03K 3/017*    (2006.01)
*H03K 19/20*    (2006.01)
*H04L 25/49*    (2006.01)

(52) U.S. Cl.
CPC ............. *H03K 3/017* (2013.01); *H03K 19/20* (2013.01); *H04L 25/4902* (2013.01)

(58) Field of Classification Search
CPC ...... H03K 3/017; H03K 19/20; H03K 5/1508; H03K 7/08; H04L 25/4902
USPC ........................................................ 327/175
See application file for complete search history.

(56) References Cited

U.S. PATENT DOCUMENTS

| | | | | |
|---|---|---|---|---|
| 4,236,121 A | * | 11/1980 | Senturia | H01L 29/42312 331/65 |
| 4,417,158 A | * | 11/1983 | Ito | H03K 5/1515 327/295 |
| 4,905,192 A | * | 2/1990 | Nogami | G11C 29/842 365/194 |
| 5,086,236 A | * | 2/1992 | Feemster | H03K 3/037 327/146 |
| 5,444,405 A | * | 8/1995 | Truong | H03K 5/1515 327/295 |
| 5,592,115 A | * | 1/1997 | Kassapian | G11C 5/145 327/295 |
| 5,818,276 A | * | 10/1998 | Garrity | H03K 5/1515 327/172 |

(Continued)

*Primary Examiner* — Ryan Jager
(74) *Attorney, Agent, or Firm* — Myers Bigel, P.A.

(57) ABSTRACT

A semiconductor device includes a plurality of pulse width modulation circuits, wherein the respective pulse width modulation circuits include a first inverter for inverting clock signals and outputting a first inversion signal, a NOR gate for performing a NOR operation on the first inversion signal and a first logic signal and outputting a second logic signal, and a second inverter for inverting the second logic signal and outputting a second inversion signal. Regarding two adjacent pulse width modulation circuits from among the pulse width modulation circuits, a clock signal of one pulse width modulation circuit is delayed from a clock signal of the other pulse width modulation circuit from among the pulse width modulation circuits by a predetermined phase, and the first logic signal of the one pulse width modulation circuit is the second logic signal of the other pulse width modulation circuit.

5 Claims, 12 Drawing Sheets

(56) References Cited

U.S. PATENT DOCUMENTS

| | | | | |
|---|---|---|---|---|
| 6,163,194 A | * | 12/2000 | Truong | H03K 5/1515 |
| | | | | 327/239 |
| 6,798,248 B2 | * | 9/2004 | Hazucha | H03K 5/1504 |
| | | | | 327/295 |
| 6,838,922 B2 | * | 1/2005 | Melcher | H03K 5/1515 |
| | | | | 327/295 |
| 6,900,682 B2 | * | 5/2005 | Truong | H03K 5/1515 |
| | | | | 327/239 |
| 7,034,595 B2 | * | 4/2006 | Lee | H03K 5/1565 |
| | | | | 327/295 |
| 7,554,373 B2 | | 6/2009 | Fujino et al. | |
| 7,612,595 B2 | | 11/2009 | Yang et al. | |
| 8,138,812 B2 | | 3/2012 | Yun et al. | |
| 8,736,309 B2 | | 5/2014 | Garrity | |
| 8,824,616 B1 | | 9/2014 | Gopalakrishnan | |
| 9,628,258 B2 | | 4/2017 | Im et al. | |
| 9,831,860 B2 | * | 11/2017 | Yang | H03K 5/1515 |
| 10,211,841 B2 | | 2/2019 | Zerbe et al. | |
| 10,355,682 B2 | * | 7/2019 | Yang | H03K 5/1515 |
| 2004/0207439 A1 | | 10/2004 | Melcher | |
| 2008/0224743 A1 | | 9/2008 | Yang et al. | |
| 2023/0155575 A1 | * | 5/2023 | Yoon | H03K 3/017 |
| | | | | 327/175 |

* cited by examiner

SEMICONDUCTOR DEVICE INCLUDING PULSE WIDTH MODULATION CIRCUITS

CROSS-REFERENCE TO RELATED APPLICATIONS

This application claims priority to and the benefit of Korean Patent Application No. 10-2021-0157079 filed on Nov. 15, 2021 and Korean Patent Application No. 10-2022-0054197 filed in the Korean Intellectual Property Office on May 2, 2022, the entire contents of both of which are incorporated herein by reference in their entireties.

BACKGROUND OF THE INVENTION

(a) Field of the Invention

The present disclosure relates to semiconductor devices.

(b) Description of the Related Art

To generate pulse signals in a semiconductor device, a method for modulating phase differences of a plurality of clock signals into pulse widths may be used.

To generate the pulse signals based on the phase differences of the clock signals, clock signals with multiple phases are generated and logic may be applied to adjacent clock signals.

The above information disclosed in this Background section is only for enhancement of understanding of the background of the invention, and therefore it may contain information that does not form the prior art that is already known in this country to a person of ordinary skill in the art.

SUMMARY OF THE INVENTION

Embodiments of the inventive concept may provide a semiconductor device for generating constant pulse signals when a duty variation is generated in the clock signals.

Further embodiments of the inventive concept may provide a semiconductor device including a pulse width modulation circuit that may be operable without a phase splitter.

Further embodiments of the inventive concept may provide a semiconductor device for generating clock signals in which there is no overlapping section or floating section between clock signals.

An embodiment of the inventive concept provides a semiconductor device including a plurality of pulse width modulation circuits, wherein the respective pulse width modulation circuits may include a first inverter for inverting clock signals and outputting a first inversion signal, a NOR gate for performing a NOR operation on the first inversion signal and a first logic signal and outputting a second logic signal, and a second inverter for inverting the second logic signal and outputting a second inversion signal. Regarding two adjacent pulse width modulation circuits from among the pulse width modulation circuits, a clock signal of one pulse width modulation circuit may be delayed from a clock signal of the other pulse width modulation circuit by a predetermined phase, and the first logic signal of the one pulse width modulation circuits may be the second logic signal of the other pulse width modulation circuit.

When a number of the pulse width modulation circuits is N, the pulse width modulation circuits may include a first pulse width modulation circuit using clock signals having a phase of 0 degrees and an N-th pulse width modulation circuit using clock signal having a phase of 360*(N−1)/N degrees, and an output signal of the NOR gate of the first pulse width modulation circuit may be input to the NOR gate of the N-th pulse width modulation circuit.

When a number of the pulse width modulation circuits is N, the predetermined phase may be 360/N degrees.

The second inversion signal may be a phase inverted clock signal.

Another embodiment of the inventive concept provides a semiconductor device including a plurality of pulse width modulation circuits, wherein the respective pulse width modulation circuits may include a first inverter for inverting a first clock signal and outputting a first inversion signal, a NOR gate for performing a NOR operation on the first inversion signal and a second clock signal, and outputting a first logic signal according to the NOR operation result; and a second inverter for inverting the first logic signal and outputting a second inversion signal, a third inverter for inverting the second inversion signal and outputting a third inversion signal, and a fourth inverter for inverting the third inversion signal and outputting a fourth inversion signal. The second clock signal may be delayed by a predetermined phase with respect to the first clock signal.

The first clock signal and the second clock signal may be input to one pulse width modulation circuit of two adjacent pulse width modulation circuits from among the pulse width modulation circuits, and the second clock signal may be input to the other pulse width modulation circuit from among the pulse width modulation circuits.

When a number of the pulse width modulation circuits is N, the pulse width modulation circuits may include a first pulse width modulation circuit using a clock signal with a phase of 0 degrees and an N-th pulse width modulation circuit using a clock signal with a phase of 360*(N−1)/N degrees, and the clock signal with a phase of 0 degrees may be input to a NOR gate of the N-th pulse width modulation circuit.

When a number of the pulse width modulation circuits is N, the predetermined phase may be 360/N degrees.

The fourth inversion signal may be a phase inverted clock signal.

Another embodiment of the inventive concept provides a semiconductor device including: a plurality of type-A pulse width modulation circuits for respectively receiving a plurality of clock signals with different phases and generating a falling edge of a first phase inverted clock signal after passing through n-numbered logic gates in response to a rising edge of the clock signal input to the type-A pulse width modulation circuits from among the clock signals; a plurality of type-B pulse width modulation circuits for respectively receiving the clock signals, and generating a falling edge of a second phase inverted clock signal after passing through (n+2)-numbered logic gates in response to a rising edge of the clock signal input to the type-B pulse width modulation circuits from among the clock signals; and a first phase blender for blending phases of the first phase inverted clock signal and the second phase inverted clock signal and outputting a third phase inverted clock signal, wherein a falling edge of the third phase inverted clock signal may have a delay corresponding to (n+1)-numbered logic gates, and a rising edge of the third phase inverted clock signal may have a same delay as the falling edge of the third phase inverted clock signal.

The respective type-A pulse width modulation circuits may generate a rising edge of the first phase inverted clock signal after passing through (n+1)-numbered logic gates in response to a rising edge of a clock signal input to an adjacent type-A pulse width modulation circuit from among the clock signals.

The respective type-B pulse width modulation circuits may generate a rising edge of the second phase inverted clock signal after passing through (n+1)-numbered logic gates in response to a rising edge of a clock signal input to the adjacent type-B pulse width modulation circuit from among the clock signals.

The type-A pulse width modulation circuits and the type-B pulse width modulation circuits may respectively include NOR gates and inverters.

An output of the NOR gate of one type-A pulse width modulation circuit of two adjacent type-A pulse width modulation circuits from among the type-A pulse width modulation circuits may be input to the NOR gate of another type-A pulse width modulation circuit.

The respective clock signals may be input to two adjacent type-B pulse width modulation circuits from among the type-B pulse width modulation circuits.

The respective clock signals may be input to the inverter of one type-B pulse width modulation circuit of the two adjacent type-B pulse width modulation circuits, and may be input to the NOR gate of the other type-B pulse width modulation circuit.

A number of the type-A pulse width modulation circuits and a number of the type-B pulse width modulation circuits may be respectively N, and the clock signals may have respective phases corresponding to integer multiples of 360/N degrees.

The third phase inverted clock signal may have a phase difference of two adjacent clock signals as a pulse width.

The semiconductor device may further include: a plurality of type-C pulse width modulation circuits for respectively receiving the clock signals and generating a rising edge of a first phase delay clock signal after passing through m-numbered logic gates in response to a rising edge of a clock signal input to the type-C pulse width modulation circuit from among the clock signals; a plurality of type-D pulse width modulation circuits for respectively receiving the clock signals, and generating a rising edge of a second phase delay clock signal after passing through m-numbered logic gates in response to a rising edge of clock signal input to the type-D pulse width modulation circuit from among the clock signals; and a second phase blender for blending phases of the first phase delay clock signal and the second phase delay clock signal and outputting a third phase delay clock signal.

The respective type-C pulse width modulation circuits may generate a falling edge of the first phase inverted clock signal after passing through (m+1)-numbered logic gates in response to a rising edge of a clock signal input to an adjacent type-C pulse width modulation circuit from among the clock signals, the respective type-D pulse width modulation circuits may generate a falling edge of the second phase inverted clock signal after passing through (m−1)-numbered logic gates in response to a rising edge of a clock signal input to an adjacent type-D pulse width modulation circuit from among the clock signals, and the type-C pulse width modulation circuits and the type-D pulse width modulation circuits may respectively include NAND gates and inverters.

DETAILED DESCRIPTION OF THE EMBODIMENTS

Figure 1:
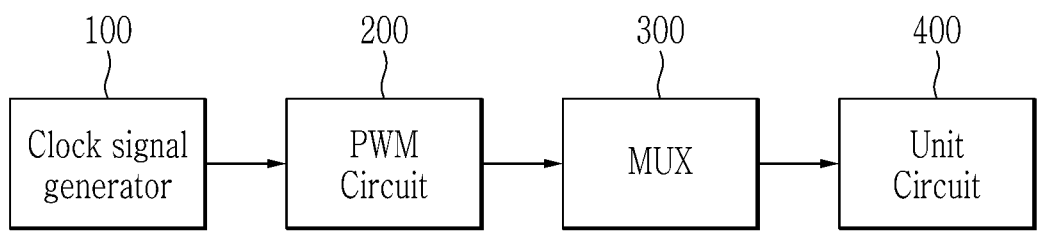
FIG. 1 illustrates a block diagram of a semiconductor device according to an embodiment of the inventive concept.

In the following detailed description, only certain embodiments of the present invention have been shown and described, simply by way of illustration. As those skilled in the art would realize, the described embodiments may be modified in various different ways, all without departing from the spirit or scope of the present invention. In the drawings, like numerals refer to like elements throughout this application and repeated descriptions may be omitted. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Accordingly, the drawings and description are to be regarded as illustrative in nature and not restrictive. In the flowcharts described with reference to the drawings, the operation order may be changed, various operations may be merged, certain operations may be divided, and certain operations may not be performed.

An expression recited in the singular may be construed as singular or plural unless the expression "one," "single," etc., is used.

FIG. 1 illustrates a block diagram of a semiconductor device according to an embodiment of the inventive concept.

The semiconductor device 10 may include a clock signal generator 100, a pulse width modulation (PWM) circuit 200, a multiplexer MUX 300, and a unit circuit 400.

The clock signal generator 100 may be configured to generate a plurality of clock signals with a plurality of different phases. A phase difference between two clock signals with adjacent phases from among a plurality of clock signals may be determined by a number of a plurality of clock signals. For example, when the number of clock signals is N (here, N is an integer that is greater than 1), a plurality of clock signals may each have a phase corresponding to an integer multiple of 360/N degrees. The phase difference between two clock signals with adjacent phases may be 360/N degrees. For example, when the clock signal generator 100 generates four clock signals, the clock signal generator 100 may generate a clock signal with a phase of 0 degrees, a clock signal with a phase of 90 degrees, a clock signal with a phase of 180 degrees, and a clock signal with a phase of 270 degrees. The clock signal generator 100 may be configured to output the generated clock signals to the pulse width modulation circuit 200.

The pulse width modulation circuit 200 may be configured to control a duty ratio of the clock signal. For example, the pulse width modulation circuit 200 may be configured to modulate a pulse width of the clock signal. The pulse width modulation circuit 200 may be configured to receive the clock signal and may be configured to output a phase delay clock signal of which a phase is delayed with respect to the clock signal to the multiplexer 300, or may be configured to output a phase inverted clock signal of which the phase is inverted and delayed with respect to the clock signal to the multiplexer 300. The pulse width modulation circuit 200 may include a plurality of semiconductor devices for processing the clock signals. For example, the pulse width modulation circuit 200 may include an inverter, a NOR gate, and a NAND gate.

When the duty variation of the clock signal is changed, the pulse width modulation circuit 200 may not be influenced by this, and may be configured to output a constant phase delay clock signal or a phase inverted clock signal. For example, when the clock signal with a duty ratio digressing from a predetermined reference (e.g., 40%, 60%, etc.,) because of a change of a pressure-volume-temperature (PVT) is input to the pulse width modulation circuit 200 in addition to the case when the clock signal with a duty ratio following a predetermined reference (e.g., 50%) is input to the pulse width modulation circuit 200, the pulse width modulation circuit 200 may be configured to output a phase delay clock signal or a phase inverted clock signal that is the same as the phase delay clock signal or the phase inverted clock signal generated by using the clock signal with a duty ratio according to a predetermined reference (e.g., 50%).

The multiplexer 300 may be configured to select at least one of a plurality of received phase delay clock signals or phase inverted clock signals, and may be configured to output the selected signal to the unit circuit 400. For example, the multiplexer 300 may be operable to output signals needed by the unit circuit 400 to the unit circuit 400.

The unit circuit 400 may be configured to arrange data into series and may output the same based on at least one of the phase delay clock signal and the phase inverted clock signal. The number of the unit circuit 400 may be plural. For example, the unit circuit 400 may be an input and output circuit for transmitting/receiving signals to/from another semiconductor device. The input and output circuit may be synchronized with at least one of the phase delay clock signal and the phase inverted clock signal, and may be configured to output or may be configured to receive signals.

When a skew of the clock signal is generated in the unit circuit 400, operation timing of the unit circuit 400 may be changed, and the semiconductor device 10 may generate operational errors. Therefore, the pulse width modulation circuit 200 may be designed so that the phase delay clock signal and the phase inverted clock signal transmitted to the unit circuit 400 may have a same delay time value.

Figure 2:
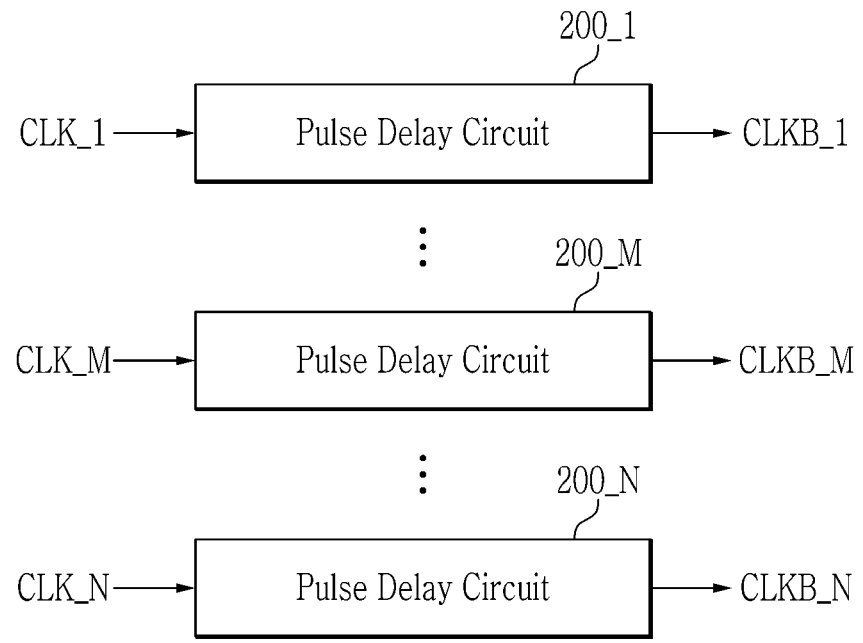
FIG. 2 illustrates an example of a block diagram of a pulse width modulation circuit shown in FIG. 1.

FIG. 2 illustrates an example of a block diagram of a pulse width modulation circuit shown in FIG. 1.

Referring to FIG. 1 and FIG. 2, the pulse width modulation circuit 200 includes N-numbered pulse delay circuits 200_1 to 200_N. In an embodiment, the respective N-numbered pulse delay circuits 200_1 to 200_N may be configured to perform a same function. The pulse width modulation circuit 200 may be configured to receive a plurality of clock signals CLK_1 to CLK_N and may be configured to output a plurality of phase inverted clock signals CLKB_1 to CLKB_N of which the pulse width is modified. The clock signals CLK_1 to CLK_N may respectively have a predetermined phase difference relative to each other. The phase inverted clock signals CLKB_1 to CLKB_N may respectively have a predetermined phase difference relative to each other, and may have the phase difference of the adjacent clock signal as the pulse width.

For example, the pulse delay circuit 200_1 may be configured to receive the clock signal CLK_1 and may output the phase inverted clock signal CLKB_1. The pulse delay circuit 200_M may be configured to receive the clock signal CLK_M and may be configured to output the phase inverted clock signal CLKB_M. The pulse delay circuit 200_N may be configured to receive the clock signal CLK_N and may be configured to output the phase inverted clock signal CLKB_N. That is, the number of the clock signals may be equal to the number of the pulse delay circuits 200_1 to 200_N. Here, N may be an integer that is equal to or greater than 2, and M may be an integer that is less than N.

The N-numbered clock signals may have a phase corresponding to an integer multiple of 360/N. For example, when two clock signals are input, the two clock signals may have phases of 0 degrees and 180 degrees. When three clock signals are input, the three clock signals may have phases of 0 degrees, 120 degrees, and 240 degrees. When four clock signals are input, the four clock signals may have phases of 0 degrees, 90 degrees, 180 degrees, and 270 degrees. As described, when the phase of the clock signal CLK_1 is 0 degrees, the phase of the clock signal CLK_M may be 360*(M−1)/N degrees, and the phase of the clock signal CLKN may be 360*(N−1)N degrees. The number of the clock signals is not limited to the examples described in the present specification, and, in other embodiments, it may be realized to be 5, 6, 8, and 10. The phase difference between the two adjacent clock signals with adjacent phases may be 360/N degrees. A maximum phase difference may be 360*(N−1)/N.

The N-numbered phase inverted clock signals may have phases corresponding to integer multiples of 360/N. For example, two phase inverted clock signals may have phases of 0 degrees and 180 degrees. The three phase inverted clock signals may have phases of 0 degrees, 120 degrees, and 240 degrees. The four phase inverted clock signals may have phases of 0 degrees, 90 degrees, 180 degrees, and 270 degrees. As described, when the phase of the phase inversion signal CLKB_1 is 0 degrees, the phase of the phase inverted clock signal CLKB_M may be 360*(M−1)N degrees, and the phase of the phase inverted clock signal CLKB_N may be 360*(N−1)/N degrees. The maximum phase difference may be 360*(N−1)/N. The number of the phase inverted clock signals CLKB_1 to CLKB_N may be equal to the number of the clock signals CLK_1 to CLK_N.

The pulse width modulation circuit 200 may be configured to generate phase inverted clock signals CLKB_1 to CLKB_N in response to rising edges of the clock signals CLK_1 to CLK_N. For example, the pulse delay circuit 200_1 may be configured to generate a phase inverted clock signal CLKB_1 in response to the rising edge of the clock signal CLK_1, the pulse delay circuit 200_M may be configured to generate a phase inverted clock signal CLKB_M in response to the rising edge of the clock signal CLK_M, and the pulse delay circuit 200_N may be configured to generate a phase inverted clock signal CLKB_N in response to the rising edge of the clock signal CLK_N. The pulse width modulation circuit 200 may use the rising edges of the clock signals CLK_1 to CLK_N, so when the duty variation of the clock signals CLK_1 to CLK_N is generated, the pulse width modulation circuit 200 may be configured to output a constant pulse signal. That is, the pulse width modulation circuit 200 may remove an influence of the duty variation.

The phase inverted clock signals CLKB_1 to CLKB_N may have the phase difference of two adjacent clock signals as the pulse width. For example, the phase inverted clock signal CLKB_1 may have the phase difference between the clock signal CLK_1 and the clock signal CLK_2 that is adjacent to the clock signal CLK_1 as the pulse width. The phase inverted clock signal CLKB_M may have the phase difference between the clock signal CLK_M and the clock signal CLK_M+1 that is adjacent to the clock signal CLK_M as the pulse width. The phase inverted clock signal CLKB_N may have the phase difference between the clock signal CLK_N and the clock signal CLK_1 that is adjacent to the clock signal CLK_N as the pulse width.

Figure 3:
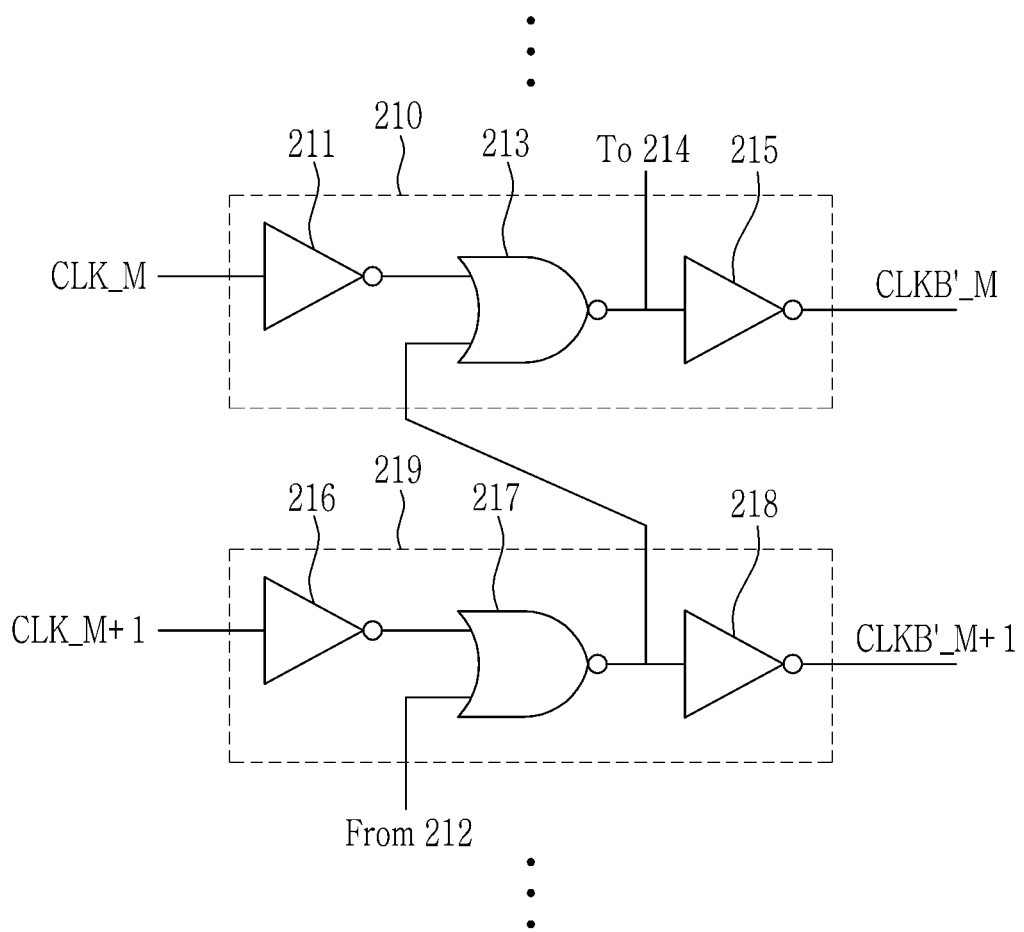
FIG. 3 illustrates an example of a circuit diagram of a pulse delay circuit shown in FIG. 2.

FIG. 3 illustrates an example of a circuit diagram of a pulse delay circuit shown in FIG. 2.

Referring to FIG. 3, the pulse width modulation circuit 200 may include N-numbered (N is an integer that is greater than 1) pulse delay circuits 210. The pulse delay circuit 210 shown in FIG. 3 may be an M-th pulse delay circuit from among the N-numbered pulse delay circuits, and the pulse delay circuit 219 may be an (M+1)-th pulse delay circuit from among the N-numbered pulse delay circuits. The pulse delay circuit 210 may be configured to receive the clock signal CLK_M and the first logic signal (From 217) and may be configured to output a phase inverted clock signal CLKB'_M. The pulse delay circuit 219 may be configured to receive the clock signal CLK_M+1 and the third logic signal (From 212) and may be configured to output a phase inverted clock signal CLKB'M+1.

The pulse delay circuit 210 may include an inverter 211, a NOR gate 213, and an inverter 215.

The inverter 211 may be configured to invert the clock signal CLK_M and may be configured to output an inversion signal to the NOR gate 213.

The NOR gate 213 may be configured to perform a NOR operation on the inversion signal and the first logic signal, and may be configured to output a second logic signal according to the NOR operation result to the inverter 215. The first logic signal may be an output of the NOR gate 217. The clock signal CLK_M+1 may be delayed by a predetermined phase with respect to the clock signal CLK_M. The predetermined phase may be 360/N degrees.

The NOR gate 213 may be configured to output a second logic signal to the NOR gate 214 of the (M−1)-th pulse delay circuit that is adjacent to the pulse delay circuit 210. The (M−1)-th pulse delay circuit may use the clock signal that is earlier than the clock signal CLK_M by a predetermined phase.

When the pulse delay circuit 210 is the first pulse delay circuit (i.e., M=1) from among the N-numbered pulse delay circuits, the output of the NOR gate 213 may be input to the NOR gate of the N-th pulse delay circuit using the clock signal with the phase of 360*(N−1)/N degrees. In the case of N=2, the output of the NOR gate 213 may be input to the NOR gate 217.

When the pulse delay circuit 210 is an N-th pulse delay circuit (i.e., M=N), the pulse delay circuit 219 may be a first pulse delay circuit. For example, the pulse delay circuit 210 and the pulse delay circuit 219 may be a last pulse delay circuit and a first pulse delay circuit in the N-numbered pulse delay circuits. The phase of the clock signal CLK_M+1 may be 0.

The inverter 215 may be configured to invert the second logic signal and may output a phase inverted clock signal CLKB'_M.

The pulse delay circuit 219 may include an inverter 216, a NOR gate 217, and an inverter 218, and may include constituent elements, such as the pulse delay circuit 210.

The rising edge of the clock signal CLK_M may sequentially pass through the inverter 211, the NOR gate 213, and the inverter 215, and may be configured to generate a falling edge of the phase inverted clock signal CLKB'_M. In a similar way, the rising edge of the clock signal CLK_M+1 may sequentially pass through the inverter 216, the NOR gate 217, and the inverter 218 and may be configured to generate a falling edge of the phase inverted clock signal CLKB'_M+1.

The rising edge of the clock signal CLK_M+1 may sequentially pass through the inverter 216, the NOR gate 217, the NOR gate 213, and the inverter 215 and may generate a rising edge of the phase inverted clock signal CLKB'_M. That is, the falling edge and the rising edge of the phase inverted clock signal CLKB'_M may be generated in response to two rising edges of the two adjacent clock signals CLK_M and CLK_M+1.

Figure 4:
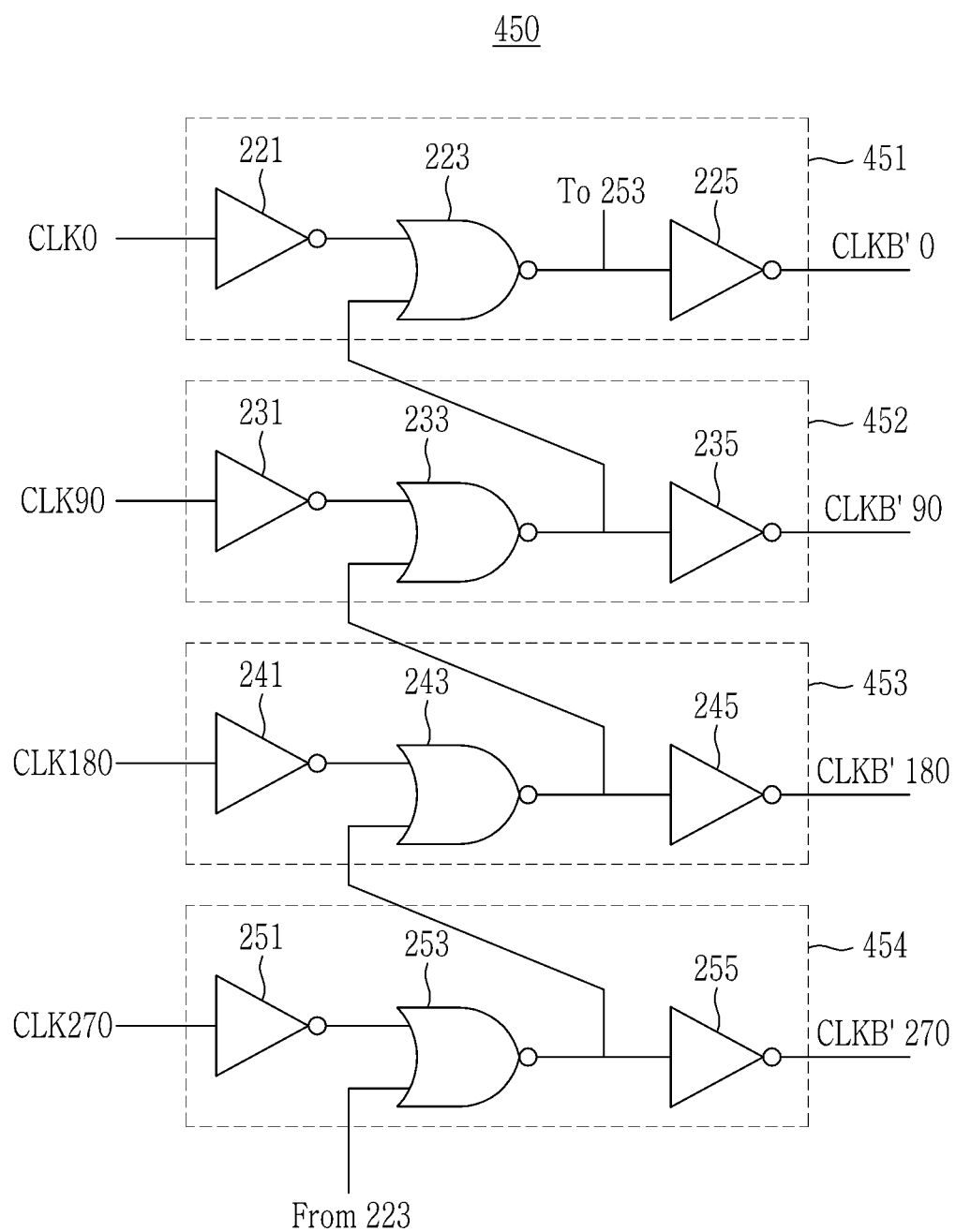
FIG. 4 illustrates a realized example of four pulse delay circuits shown in FIG. 3.

FIG. 4 illustrates a realized example of four pulse delay circuits shown in FIG. 3.

Referring to FIG. 4, the pulse width modulation circuit 450 may include four pulse delay circuits 451 to 454 including two inverters and one NOR gate. The pulse width modulation circuit 450 may be configured to receive four clock signals CLK0, CLK90, CLK180, and CLK270, and may be configured to output four phase inverted clock signals CLKB'0, CLKB'90, CLKB'180, and CLKB'270. The phases of the four clock signals CLKO, CLK90, CLK180, and CLK270 may respectively be 0, 90, 180, and 270 degrees.

The phase inverted clock signals CLKB'0, CLKB'90, CLKB'180, and CLKB'270 may have the phase difference between the two adjacent clock signals from among the clock signals CLK0, CLK90, CLK180, and CLK270 as the pulse width. For example, the pulse width modulation circuit 450 may be configured to output the phase inverted clock signal CLKB'0 having the phase difference between the clock signal CLKO and the clock signal CLK90 as the pulse width, may be configured to output the phase inverted clock signal CLKB'90 having the phase difference between the clock signal CLK90 and the clock signal CLK180 as the pulse width, may be configured to output the phase inverted clock signal CLKB' 180 having the phase difference between the clock signal CLK180 and the clock signal CLK270 as the pulse width, and may be configured to output the phase inverted clock signal CLKB'270 having the phase difference between the clock signal CLK270 and the clock signal CLK0 as the pulse width.

Regarding the pulse delay circuit 451, the inverter 221 may be configured to invert the clock signal CLK0 and may be configured to output a first inversion signal to the NOR gate 223, the NOR gate 223 may be configured to perform a NOR operation on the first inversion signal and the first logic signal and may be configured to output a second logic signal caused by the NOR operation result to the inverter 225, and the inverter 225 may be configured to invert the second logic signal and may be configured to output the phase inverted clock signal CLKB'0. Here, the first logic signal may be an output of the NOR gate 233 using the clock signal CLK90 that is delayed by a predetermined phase with respect to the clock signal CLK0. The predetermined phase may be 90 degrees. The second logic signal may be input to the NOR gate 253 of the pulse delay circuit 454.

Regarding the pulse delay circuit 452, the inverter 231 may be configured to invert the clock signal CLK90 and may be configured to output a second inversion signal to the NOR gate 233, the NOR gate 233 may be configured to perform a NOR operation on the second inversion signal and the third logic signal and may be configured to output a fourth logic signal according to the NOR operation result to the inverter 235, and the inverter 235 may be configured to invert the fourth logic signal and may be configured to output the phase inverted clock signal CLKB'90. Here, the third logic signal may be an output of the NOR gate 243 using the clock signal CLK180 that is delayed by a predetermined phase with respect to the clock signal CLK90. The predetermined phase may be 90 degrees. The fourth logic signal may be input to the NOR gate 223 of the pulse delay circuit 451.

Regarding the pulse delay circuit 453, the inverter 241 may be configured to invert the clock signal CLK180 and may be configured to output a third inversion signal to the NOR gate 243, the NOR gate 243 may be configured to perform a NOR operation on a third inversion signal and a fifth logic signal and may be configured to output a sixth logic signal caused by the NOR operation result to the inverter 245, and the inverter 245 may be configured to invert the sixth logic signal and may be configured to output the phase inverted clock signal CLKB'180. Here, the fifth logic signal may be an output of the NOR gate 253 using the clock signal CLK270 that is delayed by a predetermined phase with respect to the clock signal CLK180. The predetermined phase may be 90 degrees. The sixth logic signal may be input to the NOR gate 233 of the pulse delay circuit 452.

Regarding the pulse delay circuit 454, the inverter 251 may be configured to invert the clock signal CLK270 and may be configured to output a fourth inversion signal to the NOR gate 253, the NOR gate 253 may be configured to perform a NOR operation on a fourth inversion signal and a seventh logic signal and may be configured to output an eighth logic signal caused by the NOR operation result to the inverter 255, and the inverter 255 may be configured to invert the eighth logic signal and may be configured to output the phase inverted clock signal CLKB'270. Here, the seventh logic signal may be an output of the NOR gate 223 using the clock signal CLK0 that is delayed by a predetermined phase with respect to the clock signal CLK270. The predetermined phase may be 90 degrees. The eighth logic signal may be input to the NOR gate 243 of the pulse delay circuit 453.

Figure 5:
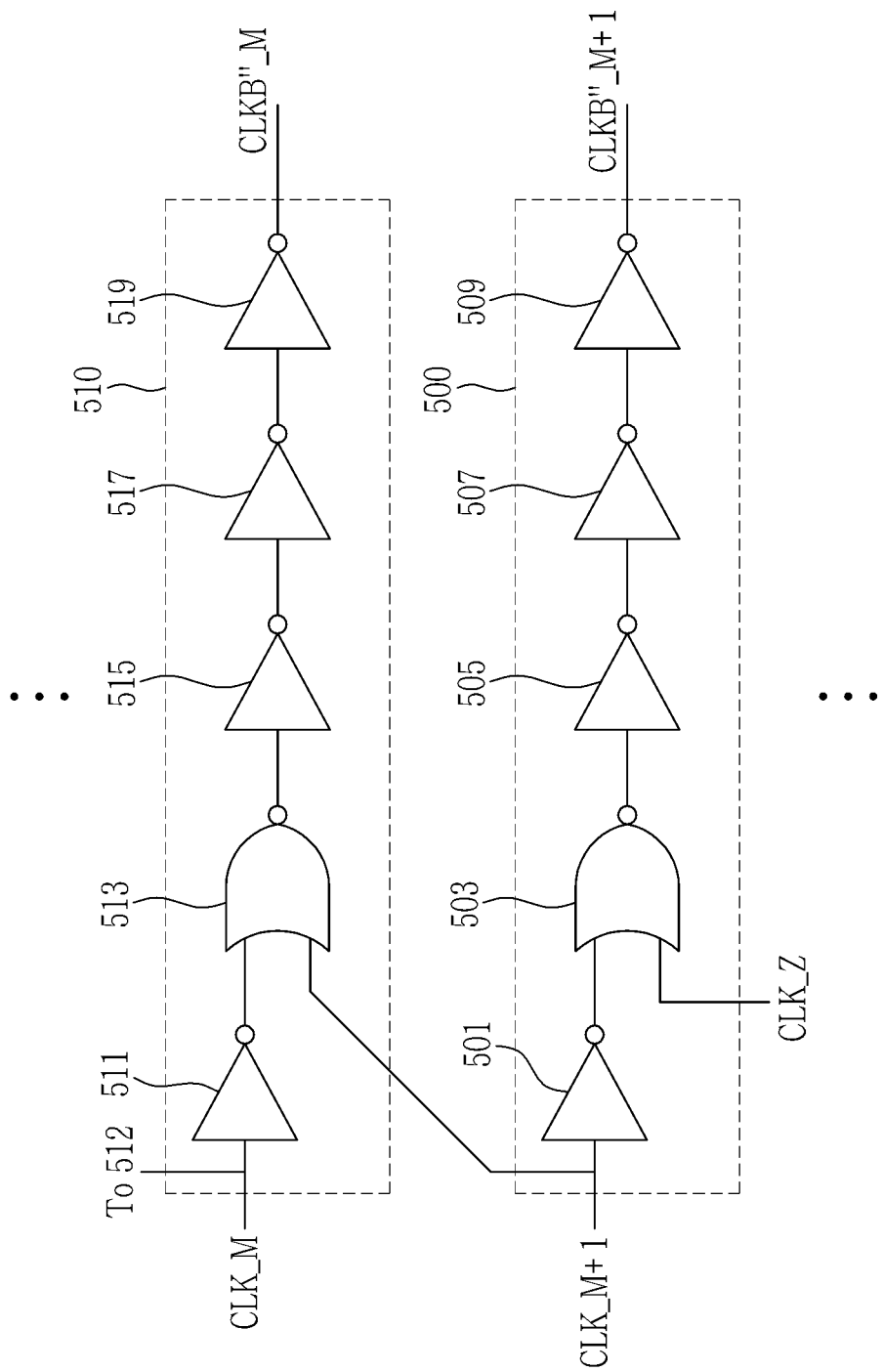
FIG. 5 illustrates another example of a circuit diagram of a pulse delay circuit shown in FIG. 2.

FIG. 5 illustrates another example of a circuit diagram of a pulse delay circuit shown in FIG. 2.

Referring to FIG. 5, the pulse width modulation circuit 200 may include N-numbered (N is an integer that is greater than 1) pulse delay circuits 510. The pulse delay circuit 510 shown in FIG. 5 is the M-th pulse delay circuit of the N-numbered pulse delay circuits, and the pulse delay circuit 500 is the (M+1)-th pulse delay circuit of the N-numbered pulse delay circuits. The pulse delay circuit 510 may be configured to receive the clock signal CLK_M and the clock signal CLK_M+1 and may be configured to output a phase inverted clock signal CLKB"_M. The clock signal CLK_M+1 may be delayed by a predetermined phase with respect to the clock signal CLK_M. The predetermined phase may be 360/N degrees. The pulse delay circuit 500 may be configured to receive the clock signal CLK_M+1 and the clock signal CLK_Z and may be configured to output a phase inverted clock signal CLKB"_M+1.

The pulse delay circuit 510 may include an inverter 511, a NOR gate 513, an inverter 515, an inverter 517, and an inverter 519.

The inverter 511 may be configured to invert the clock signal CLK_M and may be configured to output a first inversion signal to the NOR gate 513. The clock signal CLK_M may be input to the NOR gate 512 of the (M−1)-th pulse delay circuit. The (M−1)-th pulse delay circuit may use the clock signal that is earlier than the clock signal CLK_M by a predetermined phase. The predetermined phase may be 360/N degrees.

The NOR gate 513 may be configured to perform a NOR operation on the first inversion signal and the clock signal CLK_M+1, and may be configured to output a second logic signal caused by the NOR operation result to the inverter 515. The phase difference between the clock signal CLK_M and the clock signal CLK_M+1 may be 360/N degrees.

When the pulse delay circuit 510 is the N-th pulse delay circuit of the N-numbered pulse delay circuits (i.e., M=N), the pulse delay circuit 500 may be the first pulse delay circuit. For example, the pulse delay circuit 510 and the pulse delay circuit 500 may be the last pulse delay circuit and the first pulse delay circuit in the N-numbered pulse delay circuits. The phase of the clock signal CLK_M+1 may be 0.

When the pulse delay circuit 510 is the first pulse delay circuit of the N-numbered pulse delay circuits, the clock signal CLK_M may be input to the NOR gate of the N-th pulse delay circuit using the clock signal having the phase of 360*(N−1)/N. In the case of N=2, the clock signal CLK_M may be input to the NOR gate 503.

The inverter 515 may be configured to invert the second logic signal and may be configured to output a second inversion signal to the inverter 517.

The inverter 517 may be configured to invert the second inversion signal and may be configured to output a third inversion signal to the inverter 519.

The inverter 519 may be configured to invert the third logic signal and may be configured to output the phase inverted clock signal CLKB"_M.

The pulse delay circuit 500 may include an inverter 501, a NOR gate 503, an inverter 505, an inverter 507, and an inverter 509, and may include constituent elements, such as the pulse delay circuit 510.

The rising edge of the clock signal CLK_M may sequentially pass through the inverter 511, the NOR gate 513, the inverter 515, the inverter 517, and the inverter 519, and may generate a falling edge of the phase inverted clock signal CLKB"_M. In a like way, the rising edge of the clock signal CLK_M+1 may sequentially pass through the inverter 501, the NOR gate 503, the inverter 505, the inverter 507, and the inverter 509, and may generate a falling edge of the phase inverted clock signal CLKB"_M+1.

The rising edge of the clock signal CLK_M+1 may sequentially pass through the NOR gate 513, the inverter 515, the inverter 517, and the inverter 519, and may generate a rising edge of the phase inverted clock signal CLKB"_M. That is, the falling edge and the rising edge of the phase inverted clock signal CLKB"_M may be generated in response to two rising edges of the two adjacent clock signals CLK_M and CLK_M+1.

Figure 6:
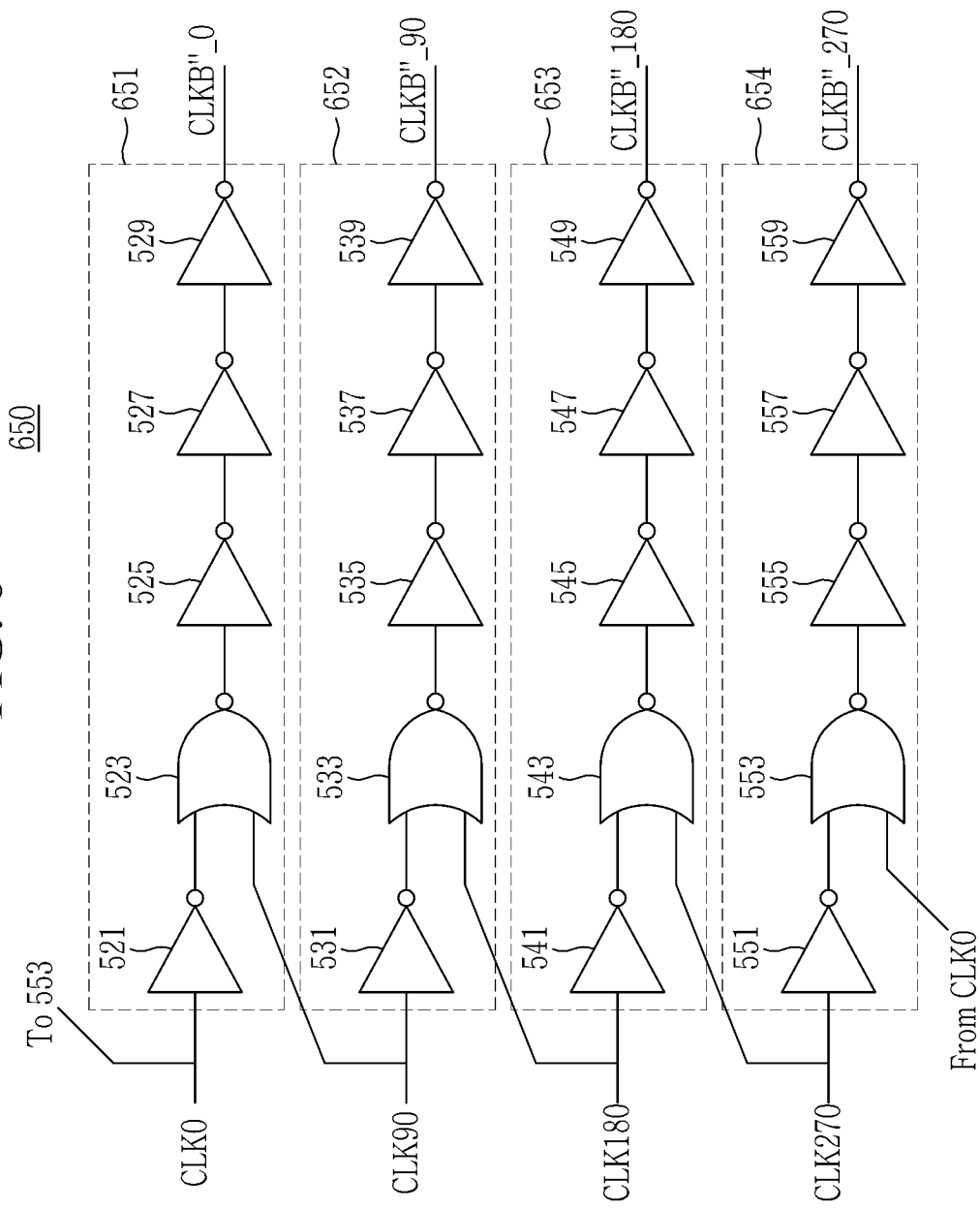
FIG. 6 illustrates a realized example of four pulse delay circuits shown in FIG. 5.

FIG. 6 illustrates a realized example of four pulse delay circuits shown in FIG. 5.

Referring to FIG. 6, the pulse width modulation circuit 650 may include four pulse delay circuits 651 to 654 including four inverters and one NOR gate. The pulse width modulation circuit 650 may be configured to receive four clock signals CLK0, CLK90, CLK180, and CLK270, and may be configured to output four phase inverted clock signals CLKB"0, CLKB"90, CLKB"180, and CLKB"270. The phases of the four clock signals CLK0, CLK90, CLK180, and CLK270 may respectively be 0, 90, 180, and 270 degrees.

The phase inverted clock signals CLKB"0, CLKB"90, CLKB"180, and CLKB"270 may have the phase difference of two adjacent clock signals of the clock signals CLK0, CLK90, CLK180, and CLK270 as the pulse width. For example, the pulse width modulation circuit 650 may be configured to output the phase inverted clock signal CLKB"0 having the phase difference between the clock signal CLK0 and the clock signal CLK90 as the pulse width, may be configured to output the phase inverted clock signal CLKB"90 having the phase difference between the clock signal CLK90 and the clock signal CLK180 as the pulse width, may be configured to output the phase inverted clock signal CLKB"180 having the phase difference between the clock signal CLK180 and the clock signal CLK270 as the pulse width, and may be configured to output the phase inverted clock signal CLKB"270 having the phase difference between the clock signal CLK270 and the clock signal CLK0 as the pulse width.

Regarding the pulse delay circuit 651, the inverter 521 may be configured to invert the clock signal CLK0 and may be configured to output a first inversion signal to the NOR gate 523, the NOR gate 523 may be configured to perform a NOR operation on the first inversion signal and the clock signal CLK90 and may be configured to output a first logic signal caused by the NOR operation result to the inverter 525, the inverter 525 may be configured to invert the first logic signal and may be configured to output a second inversion signal to the inverter 527, the inverter 527 may be configured to invert the second inversion signal and may be configured to output a third inversion signal to the inverter 529, and the inverter 529 may be configured to invert the third inversion signal and may be configured to output the phase inverted clock signal CLKB"0.

Regarding the pulse delay circuit 652, the inverter 531 may be configured to invert the clock signal CLK90 and may be configured to output a fourth inversion signal to the NOR gate 533, the NOR gate 533 may be configured to perform a NOR operation on the fourth inversion signal and the clock signal CLK180 and may output a second logic signal according to the NOR operation result to the inverter 535, the inverter 535 may be configured to invert the second logic signal and may output a fifth inversion signal to the inverter 537, the inverter 537 may be configured to invert the fifth inversion signal and may be configured to output a sixth inversion signal to the inverter 539, and the inverter 539 may be configured to invert the sixth inversion signal and may be configured to output the phase inverted clock signal CLKB"90.

Regarding the pulse delay circuit 653, the inverter 541 may be configured to invert the clock signal CLK180 and may be configured to output a seventh inversion signal to the NOR gate 543, the NOR gate 543 may be configured to perform a NOR operation on the seventh inversion signal and the clock signal CLK270 and may be configured to output a third logic signal according to the NOR operation result to the inverter 545, the inverter 545 may be configured to invert the third logic signal and may be configured to output to an eighth inversion signal to the inverter 547, the inverter 547 may be configured to invert the eighth inversion signal and may be configured to output a ninth inversion signal to the inverter 549, and the inverter 549 may be configured to invert the ninth inversion signal and may be configured to output the phase inverted clock signal CLKB"180.

Regarding the pulse delay circuit 654, the inverter 551 may be configured to invert the clock signal CLK270 and may be configured to output a tenth inversion signal to the NOR gate 553, the NOR gate 553 may be configured to perform a NOR operation on the tenth inversion signal and the clock signal CLK0 and may be configured to output a fourth logic signal according to the NOR operation result to the inverter 555, the inverter 555 may be configured to invert the fourth logic signal and may be configured to output an eleventh inversion signal to the inverter 557, the inverter 557 may be configured to invert the eleventh inversion signal and may be configured to output a twelfth inversion signal to the inverter 559, and the inverter 559 may be configured to invert the twelfth inversion signal and may be configured to output the phase inverted clock signal CLKB"270.

Figure 7:
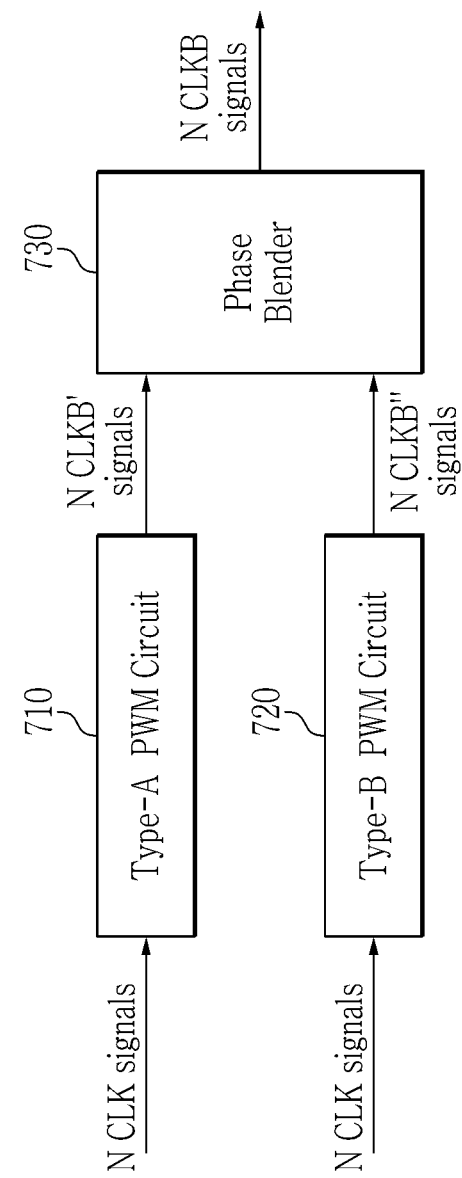
FIG. 7 illustrates another example of a block diagram of a pulse width modulation circuit shown in FIG. 1.

FIG. 7 illustrates another example of a block diagram of a pulse width modulation circuit shown in FIG. 1.

Referring to FIG. 1 and FIG. 7, the pulse width modulation circuit 200 may include a type-A pulse width modulation (PWM) circuit 710, a type-B pulse width modulation (PWM) circuit 720, and a phase blender 730.

The type-A pulse width modulation circuit 710 may be configured to receive N-numbered clock signals (or N CLK signals) and may be configured to output N-numbered phase inverted clock signals (or N CLKB' signals). The type-A pulse width modulation circuit 710 may N-numbered pulse delay circuits. N may be an integer that is greater than 1.

The type-B pulse width modulation circuit 720 may be configured to receive the N-numbered clock signals (or N CLK signals) and may be configured to output N-numbered phase inverted clock signals (or N CLKB" signals). The type-B pulse width modulation circuit 720 may include N-numbered pulse delay circuits that are different from the pulse delay circuits of the type-A pulse width modulation circuit 710. N may be an integer that is greater than 1. The N-numbered clock signals (or N CLK signals) input to the type-A pulse width modulation circuit 710 may be equivalent or similar to the N-numbered clock signals (or N CLK signals) input to the type-B pulse width modulation circuit 720.

The pulse delay circuit of the type-A pulse width modulation circuit 710 may include two inverters and one NOR gate. For example, the pulse delay circuit of the type-A pulse width modulation circuit 710 may be equivalent or similar to the pulse delay circuit 210 of FIG. 3.

The pulse delay circuit of the type-B pulse width modulation circuit 720 may include four inverters and one NOR gate. For example, the pulse delay circuit of the type-B pulse width modulation circuit 720 may be equivalent or similar to the pulse delay circuit 510 shown in FIG. 5.

The phase blender 730 may be configured to receive N-numbered phase inverted clock signals (or N CLKB' signals) from the type-A pulse width modulation circuit 710, and may be configured to receive N-numbered phase inverted clock signals (or N CLKB" signals) from the type-B pulse width modulation circuit 720.

The phase blender 730 may be configured to blend the phases of the N-numbered phase inverted clock signals (or N CLKB' signals) and the N-numbered phase inverted clock signals (or N CLKB" signals), and may be configured to output N-numbered phase inverted clock signals (or N CLKB signals). As the N-numbered phase inverted clock signals (or N CLKB signals) may have no overlapping section and floating section, the pulse width modulation circuit 200 may improve data quality of the semiconductor device 10. For example, the phase blender 730 may be configured to output a first phase inverted clock signal which is a blend of phases of the first phase inverted clock signal based on the first clock signal of the N-numbered phase inverted clock signals (or N CLKB' signals) and the first phase inverted clock signal based on the first clock signal of the N-numbered phase inverted clock signals (or N CLKB" signals). As described, the phase blender 730 may be configured to blend the phase inverted clock signal (hereinafter, M-th type-A phase inverted clock signal) based on the M-th clock signal of the N-numbered phase inverted clock signals (or N CLKB' signals) and the phase inverted clock signal (hereinafter, M-th type-B phase inverted clock signal) based on the M-th clock signal of the N-numbered phase inverted clock signals (or N CLKB" signals), and may be configured to output the M-th phase inverted clock signal.

A first phase difference may exist between a rising edge of the M-th clock signal and a falling edge of the M-th type-A phase inverted clock signal, and a second phase difference may exist between the rising edge of the M-th clock signal and a falling edge of the M-th type-B phase inverted clock signal. The first phase difference may be different from the second phase difference. The falling edge of the M-th phase inverted clock signal may be generated between the falling edge of the M-th type-A phase inverted clock signal and the falling edge of the M-th type-B phase inverted clock signal. For example, the falling edge of the M-th phase inverted clock signal may be generated at a middle time between the falling edge of the M-th type-A phase inverted clock signal and the falling edge of the M-th type-B phase inverted clock signal.

Signals generated by the pulse width modulation circuit 200 when four pulse delay circuits of the type-A pulse width modulation circuit 710 are realized and four pulse delay circuits of the type-B pulse width modulation circuit 720 are realized, that is, when it is given that N=4, will now be described with reference to FIG. 8.

Figure 8:
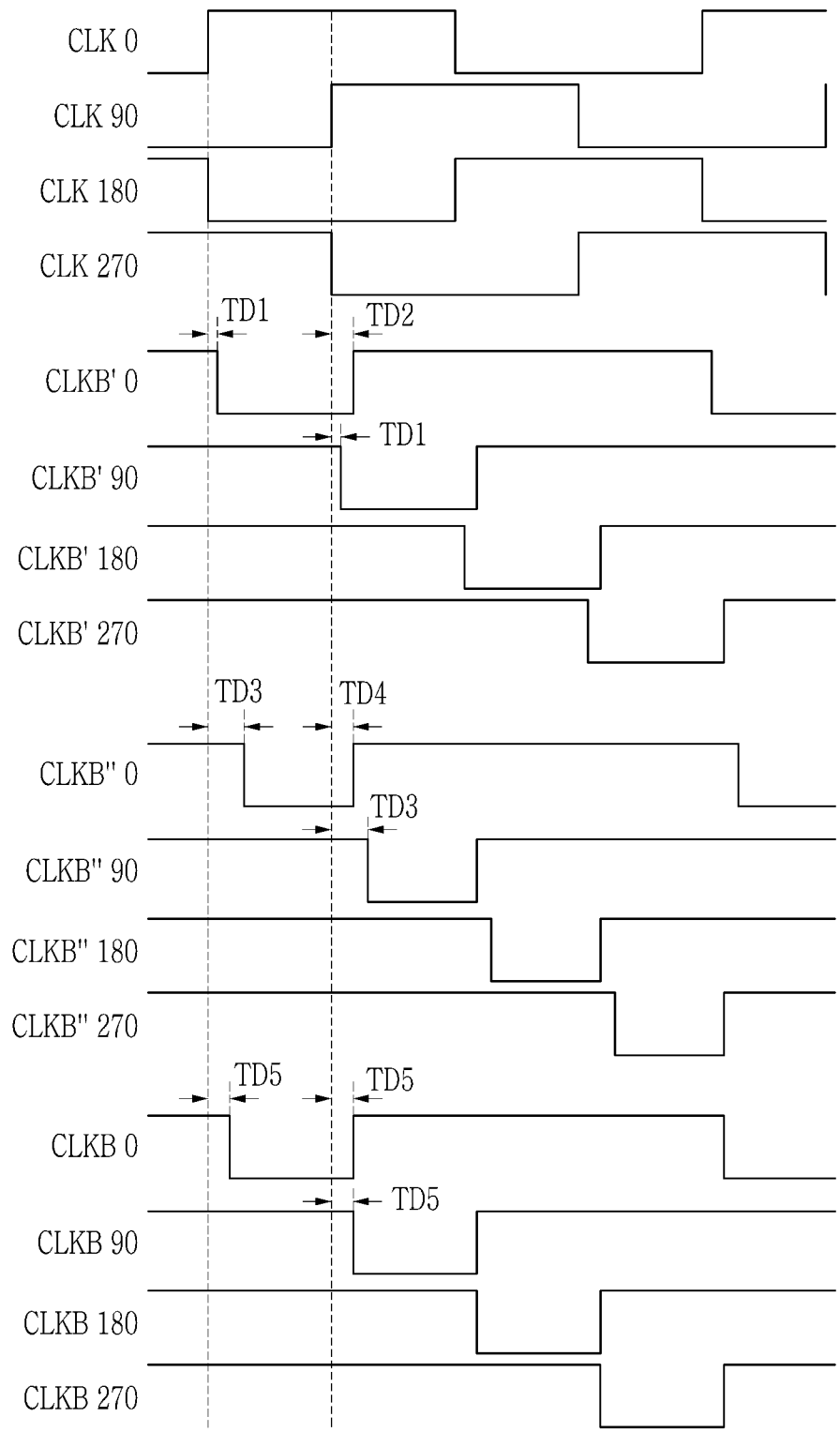
FIG. 8 illustrates a timing diagram of signals generated by a pulse width modulation circuit according to an embodiment.

FIG. 8 illustrates a timing diagram of signals generated by a pulse width modulation circuit according to an embodiment.

Referring to FIG. 8, a circuit diagram of the type-A pulse width modulation circuit 710 may be equivalent or similar to the pulse width modulation circuit 450 shown in FIG. 4, and a circuit diagram of the type-B pulse width modulation circuit 720 may be equivalent or similar to the pulse width modulation circuit 650 shown in FIG. 6.

The type-A pulse width modulation circuit 710 may include four pulse delay circuits 451 to 454 including two inverters and one NOR gate. For better understanding and ease of description, a configuration of the pulse width modulation circuit 450 shown in FIG. 4 will now be described.

The pulse delay circuit 451 may be configured to receive the clock signal CLKO and may be configured to output the phase inverted clock signal CLKB'0, the pulse delay circuit 452 may be configured to receive the clock signal CLK90 and may be configured to output the phase inverted clock signal CLKB'90, the pulse delay circuit 453 may be configured to receive the clock signal CLK180 and may be configured to output the phase inverted clock signal CLKB'180, and the pulse delay circuit 454 may be configured to receive the clock signal CLK270 and may be configured to output the phase inverted clock signal CLKB'270.

The type-A pulse width modulation circuit 710 may be configured to generate the phase inverted clock signals CLKB'0, CLKB'90, CLKB'180, and CLKB'270 in response the rising edges of the clock signals CLK0, CLK90, CLK180, and CLK270. The clock signals CLK0, CLK90, CLK180, and CLK270 pass through three gates of the pulse delay circuits of the type-A pulse width modulation circuit 710, and the phase inverted clock signals CLKB'0, CLKB'90, CLKB'180, and CLKB'270 are then generated so a delay that corresponds to three gates may be generated between the clock signals CLK0, CLK90, CLK180, and CLK270 and the phase inverted clock signals CLKB'0, CLKB'90, CLKB'180, and CLKB'270.

For example, referring to FIG. 4 and FIG. 8, as the phase inverted clock signal CLKB'0 is output when the clock signal CLK0 passes through the inverter 221, the NOR gate 223, and the inverter 225, a delay TD1 that corresponds to three gates may be generated between the rising edge of the clock signal CLK0 and the falling edge of the phase inverted clock signal CLKB'0.

In a similar way, the delay TD1 that corresponds to three gates may be generated between the rising edge of the clock signal CLK90 and the falling edge of the phase inverted clock signal CLKB'90, which may be applied to the clock signal CLK180, the clock signal CLK270, the phase inverted clock signal CLKB'180, and the phase inverted clock signal CLKB'270 in a same or similar way.

The clock signal CLK90 may pass through the inverter 231, the NOR gate 233, the NOR gate 223, and the inverter 225 to thus generate the rising edge of the phase inverted clock signal CLKB'0. That is, a delay TD2 that corresponds to four gates may be generated between the rising edge of the clock signal CLK90 and the rising edge of the phase inverted clock signal CLKB'0. The delay TD1 may be shorter than the delay TD2. The same description may be applied to the phase inverted clock signal CLKB'90, the phase inverted clock signal CLKB'180, and the phase inverted clock signal CLKB'270.

The type-B pulse width modulation circuit 720 may include four pulse delay circuits 651 to 654 including four inverters and one NOR gate. For better understanding and ease of description, a configuration of the pulse width modulation circuit 650 shown in FIG. 6 will now be described.

The pulse delay circuit 651 may be configured to receive the clock signal CLKO and may be configured to output the phase inverted clock signal CLKB"0, the pulse delay circuit 652 may be configured to receive the clock signal CLK90 and may be configured to output the phase inverted clock signal CLKB″90, the pulse delay circuit 653 may be configured to receive the clock signal CLK180 and may be configured to output the phase inverted clock signal CLKB″180, and the pulse delay circuit 654 may be configured to receive the clock signal CLK270 and may be configured to output the phase inverted clock signal CLKB″270.

The type-B pulse width modulation circuit 720 may be configured to generate phase inverted clock signals CLKB″0, CLKB″90, CLKB″180, and CLKB″270 in response to the rising edges of the clock signals CLK0, CLK90, CLK180, and CLK270. As the phase inverted clock signals CLKB″0, CLKB″90, CLKB″180, and CLKB″270 are generated when the clock signal passes through five gates of the pulse delay circuits of the type-B pulse width modulation circuit 720, a delay may be generated between the clock signals CLK0, CLK90, CLK180, and CLK270 and the phase inverted clock signals CLKB″0, CLKB″90, CLKB″180, and CLKB″270.

For example, referring to FIG. 6 and FIG. 8, the phase inverted clock signal CLKB″0 is output when the clock signal CLK0 passes through the inverter 521, the NOR gate 523, the inverter 525, the inverter 527, and the inverter 529 so a delay TD3 that corresponds to five gates may be generated between the rising edge of the clock signal CLKO and the falling edge of the phase inverted clock signal CLKB″0. The delay TD3 may be longer than the delay TD1.

In a like or similar way, the delay TD3 that corresponds to five gates may be generated between the rising edge of the clock signal CLK90 and the falling edge of the phase inverted clock signal CLKB″90, which may be applied to the clock signal CLK180, the clock signal CLK270, the phase inverted clock signal CLKB″180, and the phase inverted clock signal CLKB″270 in a same or similar way.

The clock signal CLK90 may pass through the NOR gate 523, the inverter 525, the inverter 527, and the inverter 529 to thus generate the rising edge of the phase inverted clock signal CLKB″0. That is, a delay TD4 that corresponds to four gates may be generated between the rising edge of the clock signal CLK90 and the rising edge of the phase inverted clock signal CLKB″0. The delay TD3 may be longer than the delay TD4. The delay TD4 may be equal or about equal to the delay TD2. The same description may be applied to the phase inverted clock signal CLKB″90, the phase inverted clock signal CLKB″180, and the phase inverted clock signal CLKB″270.

The phase blender 730 may be configured to blend the phases of the phase inverted clock signal CLKB′0 and the phase inverted clock signal CLKB″0 to output the phase inverted clock signal CLKB0. Hence, a delay TD5 may exist between the rising edge of the clock signal CLK0 and the falling edge of the phase inverted clock signal CLKB0. As the phase blender is used, the delay TD5 between the rising edge of the clock signal CLK0 and the falling edge of the phase inverted clock signal CLKB0 may equivalent or similar to the delay TD5 between the rising edge of the clock signal CLK90 and the falling edge of the phase inverted clock signal CLKB90. In a like or similar way, the delay TD5 may be generated between the rising edge of the clock signal CLK90 and the falling edge of the phase inverted clock signal CLKB90, and the same description may be applied to the phase inverted clock signals CLKB′90, CLKB′180, and CLKB′270, the phase inverted clock signals CLKB″0, CLKB″180, and CLKB″270, and the phase inverted clock signals CLKB90, CLKB180, and CLKB270.

Figure 9:
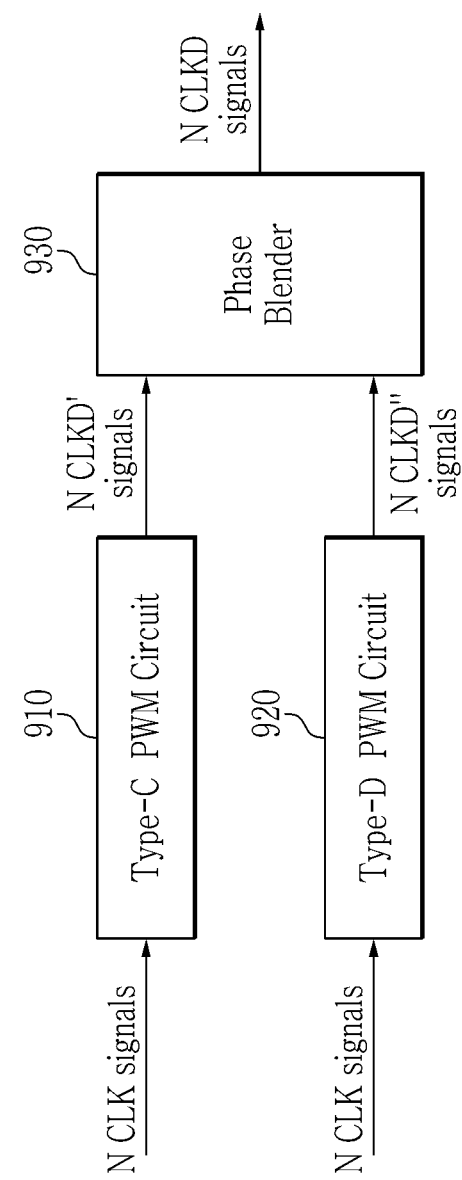
FIG. 9 illustrates another example of a block diagram of a pulse width modulation circuit shown in FIG. 1.
Figure 10:
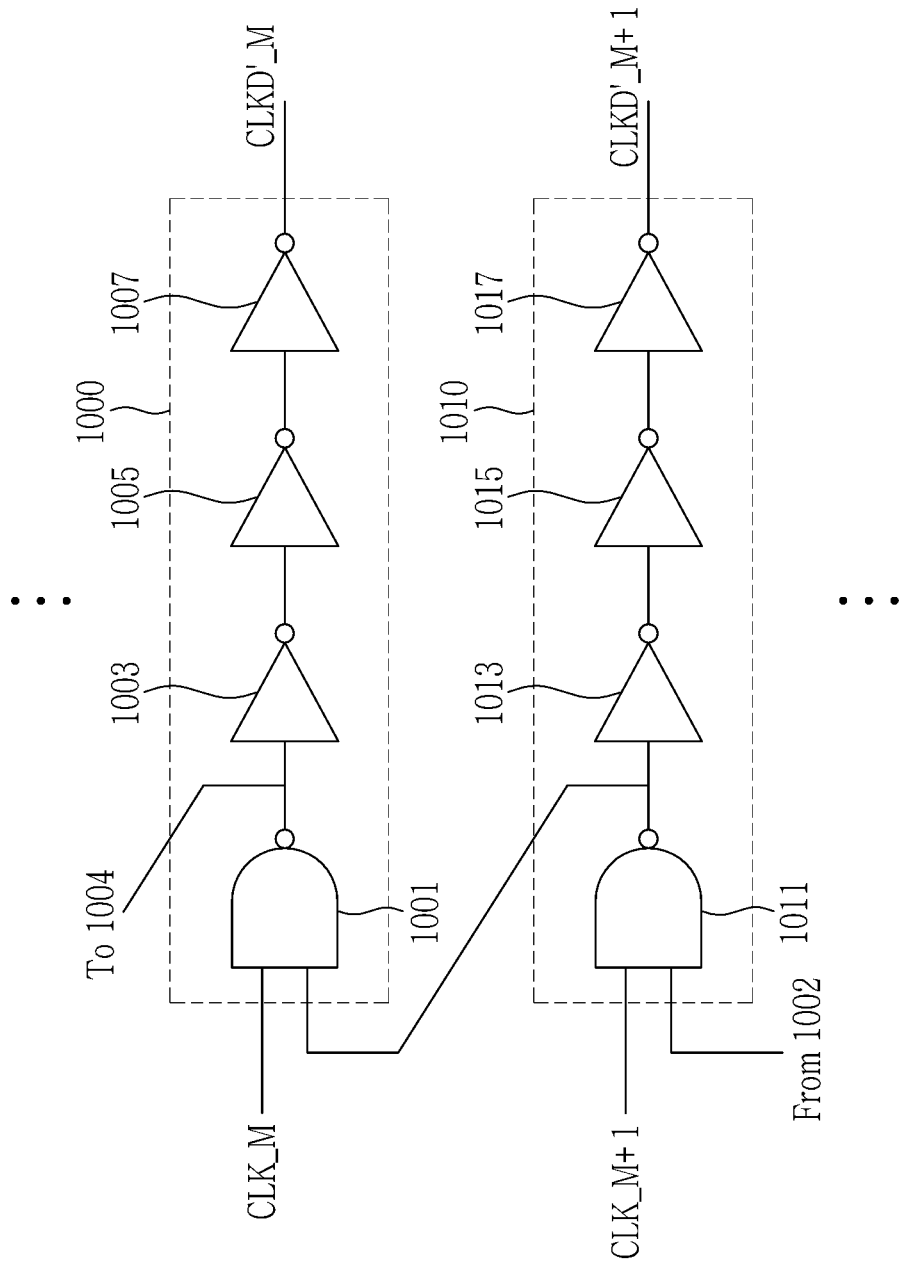
FIG. 10 illustrates an example of a circuit diagram of a unit type-C pulse width modulation circuit shown in FIG. 9.
Figure 11:
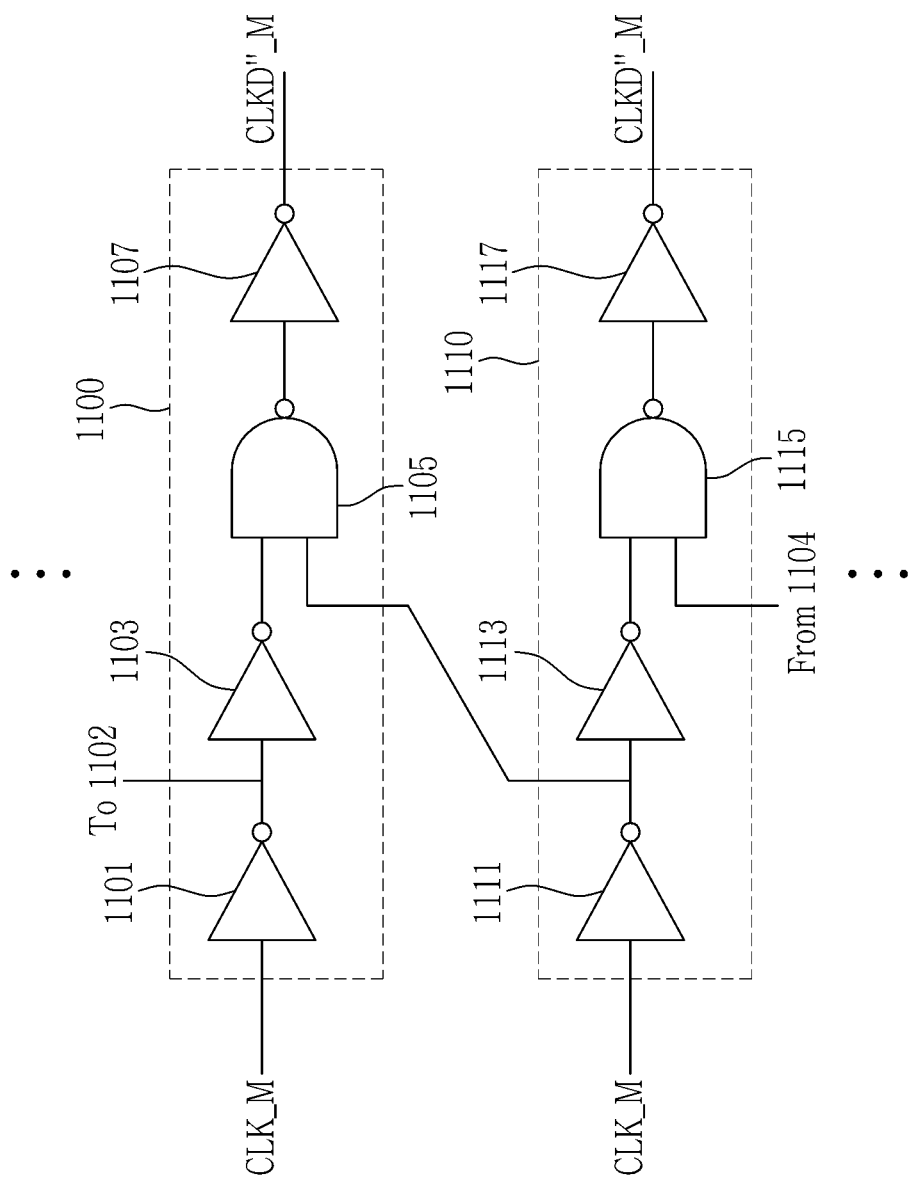
FIG. 11 illustrates an example of a circuit diagram of a unit type-D pulse width modulation circuit shown in FIG. 9.

FIG. 9 illustrates another example of a block diagram of a pulse width modulation circuit shown in FIG. 1, FIG. 10 illustrates an example of a circuit diagram of a type-C pulse width modulation circuit shown in FIG. 9, and FIG. 11 illustrates an example of a circuit diagram of a type-D pulse width modulation circuit shown in FIG. 9.

Referring to FIG. 9, FIG. 10, and FIG. 11, the pulse width modulation circuit 200 may include a type-C pulse width modulation (PWM) circuit 910, a type-D pulse width modulation (PWM) circuit 920, and a phase blender 930.

The type-C pulse width modulation circuit 910 may be configured to receive N-numbered clock signals (or N CLK signals) and may be configured to output N-numbered phase delay clock signals (or N CLKD′ signals). The type-C pulse width modulation circuit 910 may include N-numbered pulse delay circuits 1000. N may be an integer that is greater than 1.

The pulse delay circuit 1000 may be the M-th pulse delay circuit of the N-numbered pulse delay circuit, and the pulse delay circuit 1010 may be the (M+1)-th pulse delay circuit of the N-numbered pulse delay circuit. The pulse delay circuit 1000 may be configured to receive the clock signal CLK_M and may be configured to output a phase delay clock signal CLKD′_M. M may be an integer that is less than N. The pulse delay circuit 1010 may be configured to receive the clock signal CLK_M+1 and may be configured to output a phase delay clock signal CLKD′_M+1. The clock signal CLK_M+1 may be delayed by a predetermined phase with respect to the clock signal CLK_M. The predetermined phase may be 360/N degrees.

The pulse delay circuit 1000 may include three inverters and one NAND gate. For example, the pulse delay circuit 1000 may include a NAND gate 1001, an inverter 1003, an inverter 1005, and an inverter 1007.

The NAND gate 1001 may be configured to perform a NAND operation on the clock signal CLK_M and the ninth logic signal (from 1011) and may be configured to output a tenth logic signal according to the NAND operation result. The tenth logic signal may be input to the NAND gate 1004 of the (M−1)-th pulse delay circuit. The (M−1)-th pulse delay circuit may use the clock signal that is earlier than the clock signal CLK_M by a predetermined phase. The ninth logic signal may be an output of the NAND gate 1011. The NAND gate 1011 may be an output of the NAND gate 1002 of the (M+2)-th pulse delay circuit using the clock signal that is delayed by a predetermined phase with respect to the clock signal CLK_M+1 and the clock signal CLK M+1. The predetermined phase may be 360/N degrees.

When the pulse delay circuit 1000 is the first pulse delay circuit of N-numbered pulse delay circuits (i.e., M=1), the tenth logic signal may be input to the NAND gate of the N-th pulse delay circuit using the clock signal of which the phase is 360*(N−1)/N degrees. In the case of N=2, an output of the NAND gate 1001 may be input to the NAND gate 1011.

When the pulse delay circuit 1000 is the N-th pulse delay circuit of the N-numbered pulse delay circuits (i.e., M=N), the pulse delay circuit 1010 may be the first pulse delay circuit. For example, the pulse delay circuit 1000 and the pulse delay circuit 1010 may be the last pulse delay circuit and the first pulse delay circuit from among the N-numbered pulse delay circuits. In this instance, the phase of the clock signal CLK_M+1 may be 0.

The inverter 1003 may be configured to invert the tenth logic signal and may be configured to output a thirteenth inversion signal.

The inverter 1005 may be configured to invert the thirteenth inversion signal and may be configured to output a fourteenth inversion signal.

The inverter 1007 may be configured to invert the fourteenth inversion signal and may be configured to output the phase delay clock signal CLKD'_M.

The pulse delay circuit 1010 may include a NAND gate 1011, an inverter 1013, an inverter 1015, and an inverter 1017, and may include constituent elements, such as the pulse delay circuit 1000.

The rising edge of the clock signal CLK_M may sequentially pass through the NAND gate 1001, the inverter 1003, the inverter 1005, and the inverter 1007, and may generate a rising edge of the phase delay clock signal CLKD'_M. In a like or similar way, the rising edge of the clock signal CLK_M+1 may sequentially pass through the NAND gate 1011, the inverter 1013, the inverter 1015, and the inverter 1017, and may generate a rising edge of the phase delay clock signal CLKD'_M+1.

The rising edge of the clock signal CLK_M+1 may sequentially pass through the NAND gate 1011, the NAND gate 1001, the inverter 1003, the inverter 1005, and the inverter 1007, and may generate a falling edge of the phase delay clock signal CLKD'_M. That is, the rising edge and the falling edge of the phase delay clock signal CLKD'_M may be generated in response to two rising edges of the two adjacent clock signals CLK_M and CLK_M+1.

The type-D pulse width modulation circuit 920 may be configured to receive N-numbered clock signals (or N CLK signals) and may be configured to output N-numbered phase delay clock signals (or N CLKD" signals). The type-D pulse width modulation circuit 920 may include N-numbered pulse delay circuits 1100. N may be an integer that is greater than 1. The N-numbered clock signals (or N CLK signals) input to the type-C pulse width modulation circuit 910 may be equivalent or similar to the N-numbered clock signals (or N CLK signals) input to the type-D pulse width modulation circuit 920.

The pulse delay circuit 1100 may be the M-th pulse delay circuit of the N-numbered pulse delay circuits, and the pulse delay circuit 1110 may be the (M+1)-th pulse delay circuit of the N-numbered pulse delay circuits. The pulse delay circuit 1100 may be configured to receive the clock signal CLK_M and may be configured to output a phase delay clock signal CLKD"_M. M may be an integer that is less than N. The pulse delay circuit 1110 may be configured to receive the clock signal CLK_M+1 and may be configured to output a phase delay clock signal CLKD"_M+1.

The pulse delay circuit 1100 may include three inverters and one NAND gate. For example, the pulse delay circuit 1100 may include an inverter 1101, an inverter 1103, a NAND gate 1105, and an inverter 1107.

The inverter 1101 may be configured to invert the clock signal CLK_M and may be configured to output a fifteenth inversion signal. The fifteenth inversion signal may be respectively input to the inverter 1103 and a NAND gate 1102 of the (M−1)-th pulse delay circuit. The (M−1)-th pulse delay circuit may use the (M−1)-th clock signal that is earlier than the M-th clock signal CLK_M by a predetermined phase. The predetermined phase may be 360/N degrees. When the pulse delay circuit 1100 is the first pulse delay circuit (i.e., M=1) of the N-numbered pulse delay circuits, the fifteenth inversion signal may be respectively input to the inverter 1103 and the NAND gate of the N-th pulse delay circuit using the clock signal of which the phase is 360*(N−1)/N degrees. In the case of N=2, an output of the inverter 1101 may be input to the NAND gate 1115.

The inverter 1103 may be configured to invert the fifteenth inversion signal and may be configured to output a sixteenth inversion signal.

The NAND gate 1105 may be configured to perform a NAND operation on the sixteenth inversion signal and an eleventh logic signal (From 1111), and may be configured to output a twelfth logic signal according to the NAND operation result. The eleventh logic signal may be an output of the inverter 1111. The clock signal CLK_M+1 may be delayed by a predetermined phase with respect to the clock signal CLK_M. The predetermined phase may be 360/N degrees. When the pulse delay circuit 1100 is the N-th pulse delay circuit (i.e., M=N), the pulse delay circuit 1110 may be the first pulse delay circuit. For example, the pulse delay circuit 1100 and the pulse delay circuit 1110 may be the last pulse delay circuit and the first pulse delay circuit from among the N-numbered pulse delay circuits. The phase of the clock signal CLK_M+1 may be 0.

The pulse delay circuit 1110 may include an inverter 1111, an inverter 1113, a NAND gate 1115, and an inverter 1117, and may include constituent elements such as the pulse delay circuit 1100. The NAND gate 1115 may be configured to perform a NAND operation on an output signal of the inverter 1113 and an output signal of the inverter 1104 of the (M+2)-th pulse delay circuit using the clock signal that is delayed by a predetermined phase with respect to the clock signal CLK_M+1.

The rising edge of the clock signal CLK_M may sequentially pass through the inverter 1101, the inverter 1103, the NAND gate 1105, and the inverter 1107, and may generate the rising edge of the phase delay clock signal CLKD"_M. In a like or similar way, the rising edge of the clock signal CLK_M+1 may sequentially pass through the inverter 1111, the inverter 1113, the NAND gate 1115, and the inverter 1117, and may generate the rising edge of the phase delay clock signal CLKD"_M+1.

The rising edge of the clock signal CLK M+1 may sequentially pass through the inverter 1111, the NAND gate 1115, and the inverter 1117 and may generate the falling edge of the phase delay clock signal CLKD"_M. That is, the rising edge and the falling edge of the phase delay clock signal CLKD"_M may be generated in response to two rising edges of the two adjacent clock signals CLK_M and CLK_M+1.

The inverter 1107 may be configured to invert the twelfth logic signal and may be configured to output the phase delay clock signal CLKD"_M.

The phase blender 930 may be configured to receive N-numbered phase delay clock signals (or N CLKD' signals) from the type-C pulse width modulation circuit 910, and may be configured to receive N-numbered phase delay clock signals (or N CLKD" signals) from the type-D pulse width modulation circuit 920.

The phase blender 930 may be configured to blend the phases of the N-numbered phase delay clock signals (or N CLKD' signals) and the N-numbered phase delay clock signals (or N CLKD" signals), and may be configured to output N-numbered phase delay clock signals (or N CLKD signals). As the N-numbered phase delay clock signals (or N CLKD signals) have no overlapping section and floating section, the pulse width modulation circuit 200 may improve data quality of the semiconductor device 10. The N-numbered phase delay clock signals (or N CLKD signals) may be complementary signals of the N-numbered phase inverted clock signals (or N CLKB signals) described with reference to FIG. 7. That is, as the pulse width modulation circuit 200 may generate the phase inverted clock signal and the phase delay clock signal without an additional phase splitter, no delay may be generated between the phase inverted clock signal and the phase delay clock signal.

The phase blender 930 may be configured to output the first phase delay clock signal that is a blend of the phases of the first phase delay clock signal based on the first clock signal of the N-numbered phase delay clock signals (or N CLKD' signals) and the first phase delay clock signal based on the first clock signal of the N-numbered phase delay clock signals (or N CLKD" signals). As described, the phase blender 930 may be configured to output the M-th phase delay clock signal by blending the phases of the phase delay clock signal (hereinafter, M-th type-C phase delay clock signal) based on the M-th clock signal of the N-numbered phase delay clock signals (or N CLKD' signals) and the phase delay clock signal (hereinafter, M-th type-D phase delay clock signal) based on the M-th clock signal of the N-numbered phase delay clock signals (or N CLKD" signals).

A third phase difference may exist between the rising edge of the M-th clock signal and the rising edge of the M-th type-C phase delay clock signal, and a fourth phase difference may exist between the rising edge of the M-th clock signal and the rising edge of the M-th type-D phase delay clock signal. The third phase difference may be different from the fourth phase difference. The rising edge of the M-th phase delay clock signal may be generated between the rising edge of the M-th type-C phase delay clock signal and the rising edge of the M-th type-D phase delay clock signal. For example, the rising edge of the M-th phase delay clock signal may be generated in the middle time between the rising edge of the M-th type-C phase delay clock signal and the rising edge of the M-th type-D phase delay clock signal.

Signals generated by the pulse width modulation circuit 200 when four pulse delay circuits of the type-C pulse width modulation circuit 910 are realized and four pulse delay circuits of the type-D pulse width modulation circuit 920 are realized, that is, when it is given that N=4, will now be described with reference to FIG. 12.

Figure 12:
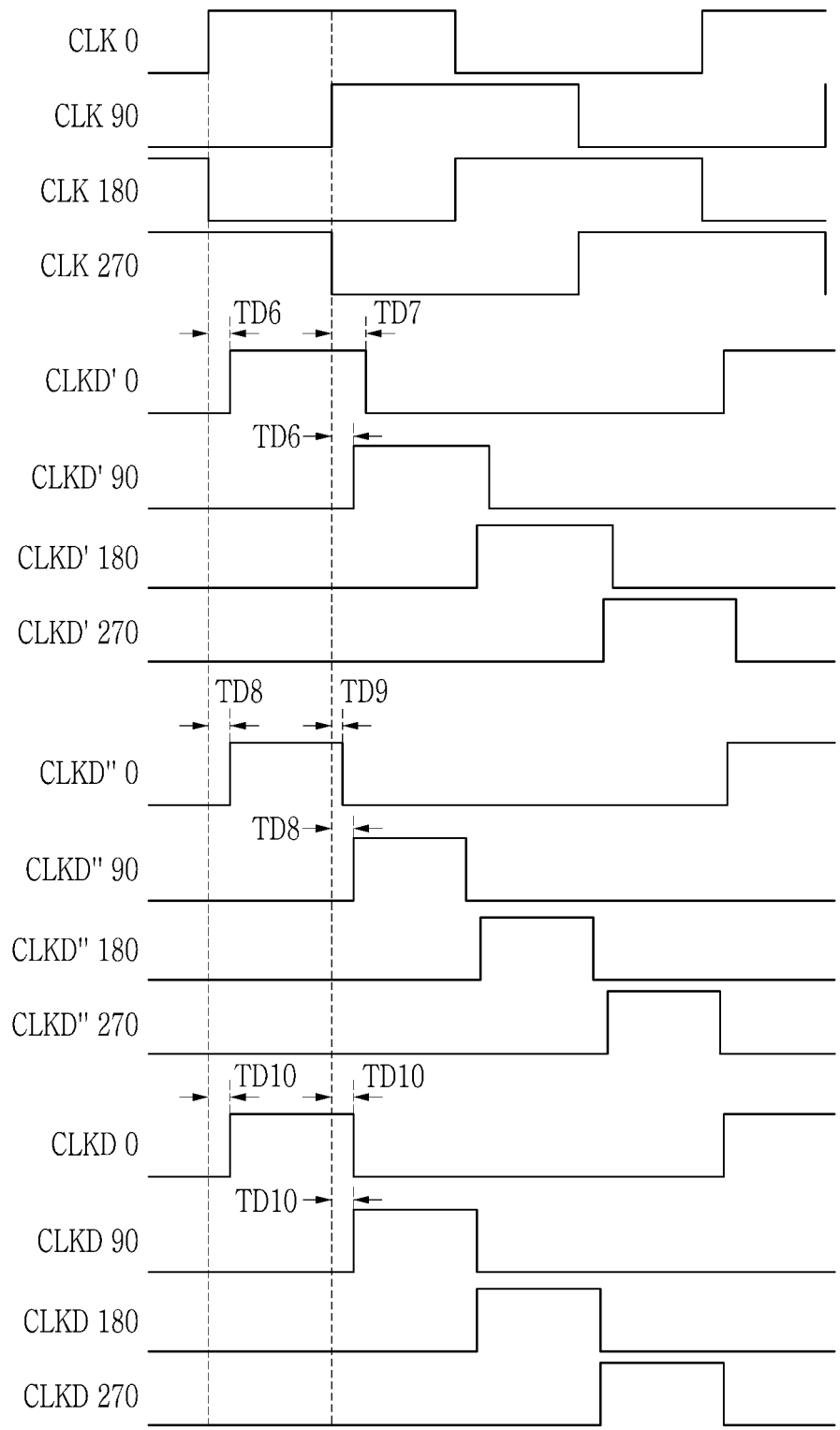
FIG. 12 illustrates a timing diagram of signals generated by a pulse width modulation circuit according to an embodiment.

FIG. 12 illustrates a timing diagram of signals generated by a pulse width modulation circuit according to an embodiment.

Referring to FIG. 9 and FIG. 12, the type-C pulse width modulation circuit 910 may include a first type-C pulse width modulation circuit, a second type-C pulse width modulation circuit, a third type-C pulse width modulation circuit, and a fourth type-C pulse width modulation circuit.

The first type-C pulse width modulation circuit may be configured to receive the clock signal CLK0 and may be configured to output a phase delay clock signal CLKD'0, the second type-C pulse width modulation circuit may be configured to receive the clock signal CLK90 and may be configured to output a phase delay clock signal CLKD'90, the third type-C pulse width modulation circuit may be configured to receive the clock signal CLK180 and may be configured to output a phase delay clock signal CLKD'180, and the fourth type-C pulse width modulation circuit may be configured to receive the clock signal CLK270 and may be configured to output a phase delay clock signal CLKD'270.

The type-C pulse width modulation circuit 910 may be configured to generate phase delay clock signals CLKD'0, CLKD'90, CLKD'180, and CLKD'270 in response to the rising edge of the clock signals CLK0, CLK90, CLK180, and CLK270. The clock signals CLK0, CLK90, CLK180, and CLK270 pass through the four gates of the pulse delay circuits of the type-C pulse width modulation circuit 910, and the phase delay clock signals CLKD'0, CLKD'90, CLKD'180, and CLKD'270 are then generated, so a delay may be generated between the clock signals CLK0, CLK90, CLK180, and CLK270 and the phase delay clock signals CLKD'O, CLKD'90, CLKD'180, and CLKD'270.

For example, the clock signal CLK0 passes through the NAND gate and three inverters to output the phase delay clock signal CLKD'0 so a delay TD6 that corresponds to four gates may be generated between the rising edge of the clock signal CLK0 and the rising edge of the phase delay clock signal CLKD'0.

In a like or similar way, the delay TD6 that corresponds to four gates may be generated between the rising edge of the clock signal CLK90 and the rising edge of the phase delay clock signal CLKD'90, which may be applied to the clock signal CLK180, the clock signal CLK270, the phase delay clock signal CLKD'180, and the phase delay clock signal CLKD'270 in a same way.

The clock signal CLK90 may pass through the inverter, the NAND gate, and the inverter to generate the falling edge of the phase delay clock signal CLKD'0. That is, a delay TD7 that corresponds to five gates may be generated between the rising edge of the clock signal CLK90 and the falling edge of the phase delay clock signal CLKD'0. The delay TD6 may be shorter than the delay TD7. The same description may be applied to the phase delay clock signal CLKD'90, the phase delay clock signal CLKD' 180, and the phase delay clock signal CLKD'270.

The type-D pulse width modulation circuit 920 may include a first type-D pulse width modulation circuit, a second type-D pulse width modulation circuit, a third type-D pulse width modulation circuit, and a fourth type-D pulse width modulation circuit, The first type-D pulse width modulation circuit may be configured to receive the clock signal CLK0 and may be configured to output a phase delay clock signal CLKD"0, the second type-D pulse width modulation circuit may be configured to receive the clock signal CLK90 and may be configured to output a phase delay clock signal CLKD"90, the third type-D pulse width modulation circuit may be configured to receive the clock signal CLK180 and may be configured to output a phase delay clock signal CLKD"180, and the fourth type-D pulse width modulation circuit may be configured to receive the clock signal CLK270 and may be configured to output a phase delay clock signal CLKD"270.

The type-D pulse width modulation circuit 920 may be configured to generate phase delay clock signals CLKD"0, CLKD"90, CLKD"180, and CLKD"270 in response to the rising edges of the clock signals CLK0, CLK90, CLK180, and CLK270. The clock signals CLK0, CLK90, CLK180, and CLK270 pass through four gates of the pulse delay circuits of the type-D pulse width modulation circuit 920, and the phase delay clock signals CLKD"0, CLKD"90, CLKD"180, and CLKD"270 are then generated so a delay may be generated between the clock signals CLK0, CLK90, CLK180, and CLK270 and the phase delay clock signals CLKD"0, CLKD"90, CLKD"180, and CLKD"270.

For example, as the clock signal CLKO passes through the inverter, the inverter, the NAND gate, and the inverter to output the phase delay clock signal CLKD"0, a delay TD8 that corresponds to four gates may be generated between the rising edge of the clock signal CLK0 and the rising edge of the phase delay clock signal CLKD"0. The delay TD8 may be equal to or about equal to the delay TD6.

In a like or similar way, the delay TD8 that corresponds to four gates may be generated between the rising edge of the clock signal CLK90 and the falling edge of the phase delay clock signal CLKD"90, which may be applied to the clock signal CLK180, the clock signal CLK270, the phase delay clock signal CLKD"180, and the phase delay clock signal CLKD"270 in a same or similar way.

The clock signal CLK90 may pass through the inverter, the NAND gate, and the inverter to generate the falling edge of the phase delay clock signal CLKD"0. That is, a delay TD9 that corresponds to three gates may be generated between the rising edge of the clock signal CLK90 and the falling edge of the phase delay clock signal CLKD"0. The delay TD8 may be longer than the delay TD9. The same description may be applied to the phase delay clock signal CLKD"90, the phase delay clock signal CLKD"180, and the phase delay clock signal CLKD"270.

The phase blender 930 may be configured to blend phases of the phase delay clock signal CLKD'0 and the phase delay clock signal CLKD"0 and may be configured to output a phase delay clock signal CLKD0. A delay TD10 may exist between the rising edge of the clock signal CLK0 and the rising edge of the phase delay clock signal CLKD0. As the phase blender is used, the delay TD10 between the rising edge of the clock signal CLK0 and the rising edge of the phase delay clock signal CLKD0 may be equal to or about equal to the delay TD10 between the rising edge of the clock signal CLK90 and the rising edge of the phase delay clock signal CLKD90. In a like or similar way, the delay TD10 may be generated between the rising edge of the clock signal CLK90 and the rising edge of the phase delay clock signal CLKD90, and the same description may be applied to the phase delay clock signals CLKD'90, CLKD'180, and CLKD'270, the phase delay clock signals CLKD"0, CLKD"180, and CLKD"270, and the phase delay clock signals CLKD90, CLKD180, and CLKD270.

Figure 13:
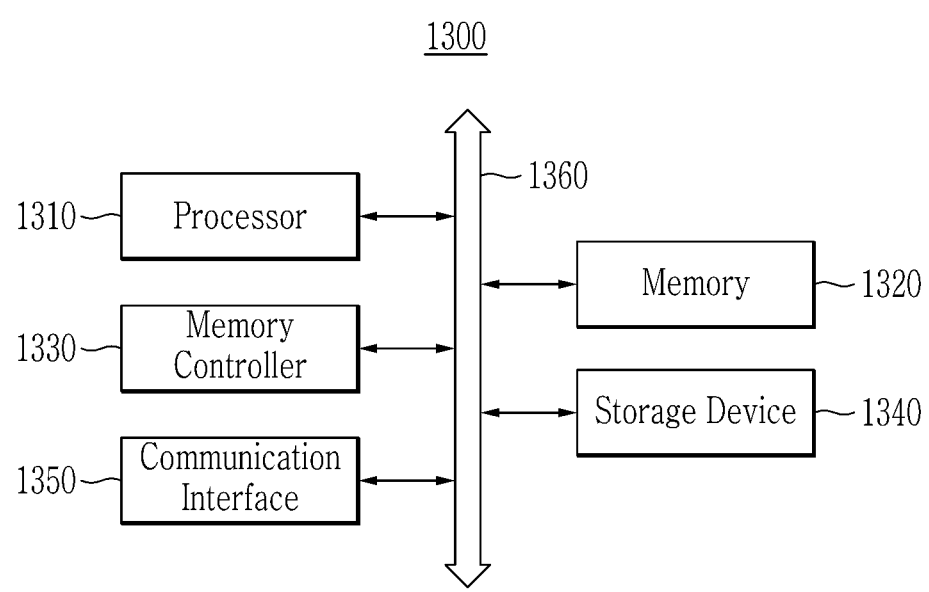
FIG. 13 illustrates a block diagram of a computer system according to an embodiment.

FIG. 13 illustrates a block diagram of a computer system according to an embodiment.

Referring to FIG. 13, the computing system 1300 includes a processor 1310, a memory 1320, a memory controller 1330, a storage device 1340, a communication interface 1350, and a bus 1360. The computing system 1300 may further include other general-purpose constituent elements.

The processor 1310 is configured to control operation of the respective constituent elements of the computing system 1300. The processor 1310 may be realized with at least one of various types of processing units, such as a central processing unit (CPU), an application processor (AP), or a graphics processing unit (GPU).

The memory 1320 is configured to store various types of data and instructions. The memory controller 1330 is configured to control transmission of data or instructions to/from the memory 1320. The memory controller 1330 may be configured to control the memory 1320 by using at least one of the clock signal, the phase inverted clock signal, and the phase delay clock signal described with reference to FIG. 1 to FIG. 12. In an embodiment, the memory controller 1330 may be provided as an additional chip that is different from the processor 1310. In an embodiment, the memory controller 1330 may be provided as an inner component of the processor 1310.

The storage device 1340 may be configured to non-temporarily store programs and data. In an embodiment, the storage device 1340 may be realized as a non-volatile memory. The communication interface 1350 may be configured to support wired and wireless network communication of the computing system 1300. The communication interface 1350 may support various types of communication methods in addition to the network communication. The bus 1360 may be configured to provide communication functions among the constituent elements of the computing system 1300. The bus 1360 may include at least one type of bus according to a communication protocol among the constituent elements.

In an embodiment, the respective constituent elements described with reference to FIG. 1 to FIG. 13 or combinations of two or more constituent elements may be realized with digital circuits, programmable or non-programmable logic devices or arrays, or application specific integrated circuits (ASIC).

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A semiconductor device comprising:
a plurality of pulse width modulation circuits,
wherein each of the plurality of pulse width modulation circuits comprises:
a first inverter configured to invert a first clock signal and to output a first inversion signal,
a NOR gate configured to perform a NOR operation on the first inversion signal and a second clock signal and to output a first logic signal according to the NOR operation result,
a second inverter configured to invert the first logic signal and to output a second inversion signal,
a third inverter configured to invert the second inversion signal and to output a third inversion signal, and
a fourth inverter configured to invert the third inversion signal and to output a fourth inversion signal, and
wherein a first one of the plurality of pulse width modulation circuits is configured to receive the first clock signal and the second clock signal,
wherein a second one of the plurality of pulse width modulation circuits is configured to receive the second clock signal, the second clock signal being the first clock signal of the second one of the plurality of pulse width modulation circuits, and
wherein the second clock signal is delayed by a predetermined phase with respect to the first clock signal.

2. The semiconductor device of claim 1, wherein the first and second ones of the plurality of pulse width modulation circuits are adjacent to each other.

3. The semiconductor device of claim 1, wherein a number of the pulse width modulation circuits is N, wherein the first one of the pulse width modulation circuits is configured to receive the first clock signal having a phase of 0 degrees and an N-th one of the plurality of pulse width modulation circuits is configured to receive an Nth clock signal having a phase of 360* (N−1)/N degrees, and wherein the NOR gate of the N-th pulse width modulation circuit is configured to receive the first clock signal as the second clock signal.

4. The semiconductor device of claim 1, wherein a number of the pulse width modulation circuits is N and the predetermined phase is 360/N degrees.

5. The semiconductor device of claim 1, wherein the fourth inversion signal is a phase inverted clock signal.

* * * * *